(12) United States Patent
Ding et al.

(10) Patent No.: US 12,279,408 B2
(45) Date of Patent: Apr. 15, 2025

(54) SEMICONDUCTOR DEVICE AND STACK OF SEMICONDUCTOR CHIPS

(71) Applicant: Samsung Electronics Co., Ltd., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/405,736

(22) Filed: Jan. 5, 2024

(65) Prior Publication Data

US 2024/0164081 A1    May 16, 2024

Related U.S. Application Data

(63) Continuation of application No. 17/474,436, filed on Sep. 14, 2021, now Pat. No. 11,871,553.

(30) Foreign Application Priority Data

Feb. 23, 2021    (KR) .................. 10-2021-0023931

(51) Int. Cl.
*H10B 10/00*    (2023.01)
*H01L 21/02*    (2006.01)
(Continued)

(52) U.S. Cl.
CPC ......... *H10B 10/18* (2023.02); *H01L 21/0259* (2013.01); *H01L 21/823807* (2013.01);
(Continued)

(58) Field of Classification Search
CPC .......... H01L 21/0259; H01L 21/02603; H01L 21/768; H01L 21/76898; H01L 21/823431;
(Continued)

(56) References Cited

U.S. PATENT DOCUMENTS

2010/0187694 A1    7/2010  Yu et al.
2011/0318923 A1*  12/2011  Park .................. H01L 21/76898
                                                          438/675
(Continued)

OTHER PUBLICATIONS

Notice of Allowance and Search Report dated Oct. 30, 2024 issued in corresponding Taiwanese Patent Application No. 110133771.

*Primary Examiner* — David C Spalla
(74) *Attorney, Agent, or Firm* — Harness, Dickey & Pierce, P.L.C.

(57) ABSTRACT

A semiconductor device includes a substrate including a logic cell region and a connection region, a dummy transistor on the connection region, an intermediate connection layer on the dummy transistor, the intermediate connection layer including a connection pattern electrically connected to the dummy transistor, a first metal layer on the intermediate connection layer, an etch stop layer between the intermediate connection layer and the first metal layer, the etch stop layer covering a top surface of the connection pattern, and a penetration contact extended from the first metal layer toward a bottom surface of the substrate penetrating the connection region.

20 Claims, 44 Drawing Sheets

(51) Int. Cl.
   *H01L 21/8238*   (2006.01)
   *H01L 27/092*    (2006.01)
   *H01L 29/06*     (2006.01)
   *H01L 29/08*     (2006.01)
   *H01L 29/417*    (2006.01)
   *H01L 29/423*    (2006.01)
   *H01L 29/66*     (2006.01)
   *H01L 29/78*     (2006.01)
   *H01L 29/786*    (2006.01)
   *H10B 12/00*     (2023.01)

(52) U.S. Cl.
   CPC ......... *H01L 21/823814* (2013.01); *H01L 21/823821* (2013.01); *H01L 21/823871* (2013.01); *H01L 27/092* (2013.01); *H01L 29/0665* (2013.01); *H01L 29/0847* (2013.01); *H01L 29/41733* (2013.01); *H01L 29/41791* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78618* (2013.01); *H01L 29/78696* (2013.01); *H10B 12/50* (2023.02)

(58) Field of Classification Search
   CPC ..... H01L 21/823807; H01L 21/823814; H01L 21/823821; H01L 21/823871; H01L 21/845; H01L 23/481; H01L 23/5226; H01L 25/0657; H01L 27/0886; H01L 27/092; H01L 27/0924; H01L 27/1211; H01L 29/0665; H01L 29/0669; H01L 29/0673; H01L 29/0847; H01L 29/41733; H01L 29/41791; H01L 29/42392; H01L 29/66439; H01L 29/66545; H01L 29/66742; H01L 29/66795; H01L 29/775; H01L 29/785; H01L 29/7851; H01L 29/7853; H01L 29/7855; H01L 29/78618; H01L 29/78696; H01L 2029/7858; H01L 2225/06541; H01L 2924/14; H10B 10/18; H10B 12/50

See application file for complete search history.

(56) References Cited

U.S. PATENT DOCUMENTS

| | | |
|---|---|---|
| 2013/0221494 A1 | 8/2013 | Ramachandran et al. |
| 2013/0249045 A1* | 9/2013 | Kang .................... H01L 23/562 |
| | | 257/499 |
| 2014/0124951 A1 | 5/2014 | Lee et al. |
| 2014/0235052 A1* | 8/2014 | Park .................. H01L 21/76864 |
| | | 438/653 |
| 2015/0129978 A1 | 5/2015 | Moon et al. |
| 2015/0371928 A1 | 12/2015 | Chen et al. |
| 2016/0020145 A1* | 1/2016 | Lee ................... H01L 21/31053 |
| | | 438/618 |
| 2018/0350947 A1 | 12/2018 | Liao et al. |
| 2020/0219810 A1 | 7/2020 | Lee et al. |
| 2021/0036413 A1 | 2/2021 | Kim et al. |
| 2021/0296156 A1* | 9/2021 | Leobandung ..... H01L 29/66795 |

* cited by examiner

SEMICONDUCTOR DEVICE AND STACK OF SEMICONDUCTOR CHIPS

CROSS-REFERENCE TO RELATED APPLICATIONS

This U.S. non-provisional patent application is a continuation of U.S. application Ser. No. 17/474,436, filed on Sep. 14, 2021, and claims priority under 35 U.S.C. § 119 to Korean Patent Application No. 10-2021-0023931, filed on Feb. 23, 2021, in the Korean Intellectual Property Office, the entire contents of each of which are hereby incorporated by reference.

BACKGROUND

The present disclosure relates to semiconductor devices, and in particular, to semiconductor devices including a field effect transistor and a stack of semiconductor chips.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

Some example embodiments of the inventive concepts provide semiconductor devices with improved electric and reliability characteristics.

Some example embodiments of the inventive concepts provide stacks of semiconductor chips with electric and reliability characteristics.

According to some example embodiments of the inventive concepts, a semiconductor device may include a substrate including a logic cell region and a connection region, a dummy transistor on the connection region, an intermediate connection layer on the dummy transistor, the intermediate connection layer including a connection pattern electrically connected to the dummy transistor, a first metal layer on the intermediate connection layer, an etch stop layer between the intermediate connection layer and the first metal layer, the etch stop layer covering a top surface of the connection pattern, and a penetration contact extended from the first metal layer toward a bottom surface of the substrate penetrating the connection region. An upper portion of the penetration contact may protrude above the etch stop layer, and the first metal layer may include a first interconnection line, a second interconnection line, and a via below the second interconnection line. The via may penetrate the etch stop layer and connect the second interconnection line to the connection pattern, and a top surface of the penetration contact may be in direct contact with a bottom surface of the first interconnection line.

According to some example embodiments of the inventive concepts, a semiconductor device may include a substrate including a logic cell region and a connection region, a dummy transistor on the connection region, an intermediate connection layer on the dummy transistor, a first metal layer on the intermediate connection layer, an etch stop layer between the intermediate connection layer and the first metal layer, and a penetration contact extended from the first metal layer toward a bottom surface of the substrate penetrating the connection region. An upper portion of the penetration contact may protrude above the etch stop layer, and the first metal layer may include a first interconnection line, a second interconnection line, and a via below the second interconnection line. The via may penetrate the etch stop layer and connect the second interconnection line to the intermediate connection layer. A top surface of the penetration contact may be in direct contact with a bottom surface of the first interconnection line, and a top surface of the via may be in direct contact with a bottom surface of the second interconnection line. The lowermost level of the bottom surface of the first interconnection line may be lower than the lowermost level of the bottom surface of the second interconnection line.

According to some example embodiments of the inventive concepts, a semiconductor device may include a substrate including a logic cell region and a connection region, an active pattern on each of the logic cell region and the connection region, a device isolation layer covering a lower side surface of the active pattern, an upper portion of the active pattern protruding above the device isolation layer, a gate electrode crossing the active pattern, a source/drain pattern adjacent to a side of the gate electrode, the source/drain pattern filling a recess in the upper portion of the active pattern, an intermediate connection layer on the gate electrode and the source/drain pattern, the intermediate connection layer including an active contact electrically connected to the source/drain pattern and a gate contact electrically connected to the gate electrode, a first metal layer on the intermediate connection layer, the first metal layer including a first interconnection line, a second interconnection line, and a via electrically connecting the second interconnection line to the intermediate connection layer, an etch stop layer between the intermediate connection layer and the first metal layer, a penetration contact extended from the first metal layer toward a bottom surface of the substrate penetrating the connection region, an upper portion of the penetration contact protruding above the etch stop layer, and a protection insulating pattern on the etch stop layer to cover the upper portion of the penetration contact. A side surface of the upper portion of the penetration contact may include a first upper side surface and a second upper side surface on the first upper side surface. The etch stop layer may cover the first upper side surface, and the protection insulating pattern may cover the second upper side surface. A top surface of the penetration contact may be in direct contact with a bottom surface of the first interconnection line.

According to some example embodiments of the inventive concepts, a stack of semiconductor chips may include a memory chip and a logic chip stacked on the memory chip. The logic chip may include a substrate, on which an integrated circuit is formed, a metal layer on the substrate, and a penetration contact below the metal layer penetrating the substrate. The penetration contact may be connected to a metal layer of the memory chip, and the metal layer may include a first metal layer, the first metal layer may be a lowermost layer of the metal layer and the first metal layer includes a first interconnection line, a second interconnection line, and a via below the second interconnection line. A top surface of the penetration contact may be in direct contact with a bottom surface of the first interconnection line, and a top surface of the via may be in direct contact with a bottom surface of the second interconnection line. The lowermost level of the bottom surface of the first interconnection line may be lower than the lowermost level of the bottom surface of the second interconnection line.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
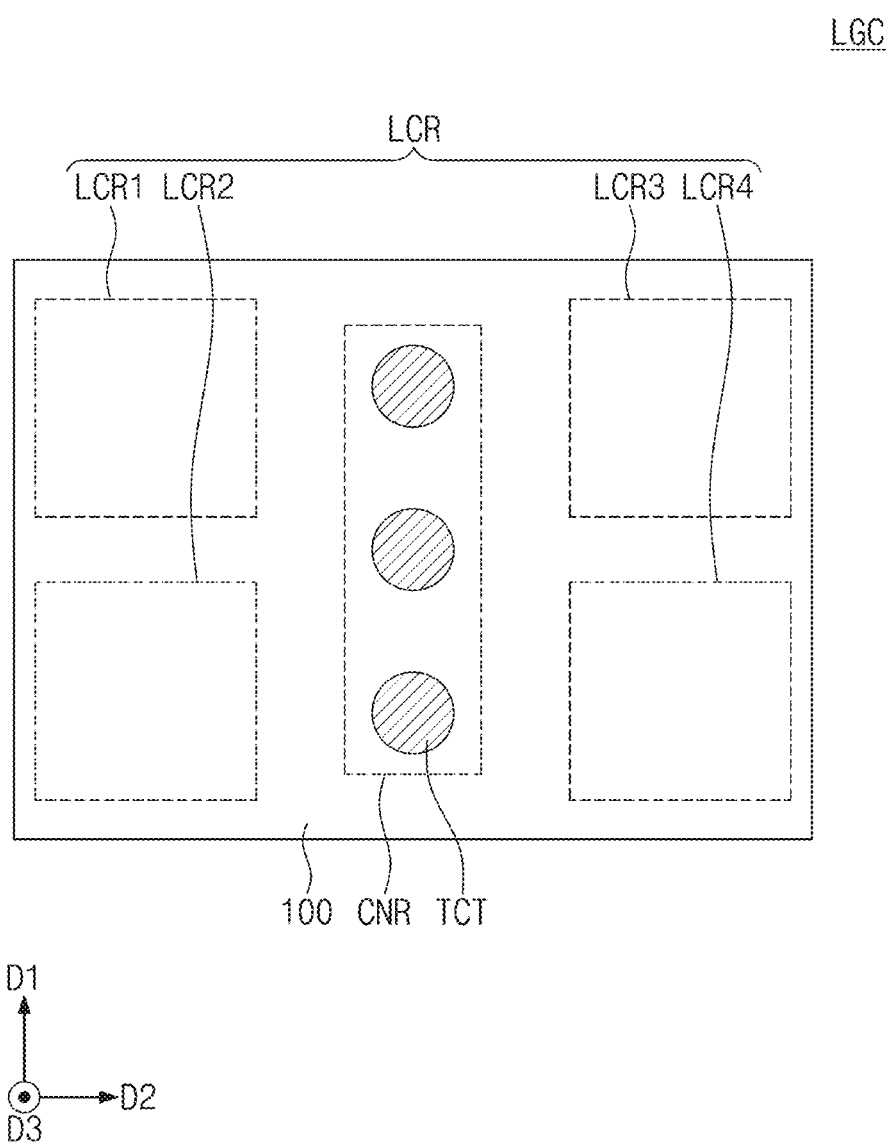
FIG. 1 is a plan view illustrating a semiconductor device according to some example embodiments of the inventive concepts.

FIG. 1 is a plan view illustrating a semiconductor device according to some example embodiments of the inventive concepts.

Referring first to FIG. 1, a logic chip LGC may be provided. The logic chip LGC may include logic cell regions LCR on a substrate 100. As an example, the logic cell regions LCR may include first to fourth logic cell regions LCR1-LCR4. The first to fourth logic cell regions LCR1-LCR4 may be two-dimensionally arranged on the substrate 100. Each of the logic cell regions LCR may be a region, on which logic cells (e.g., standard cells) constituting a logic circuit are disposed.

The logic chip LGC may further include a connection region CNR between the logic cell regions LCR. The first to fourth logic cell regions LCR1-LCR4 may be provided to surround the connection region CNR. At least one penetration contact TCT may be provided in the connection region CNR.

Figure 2:
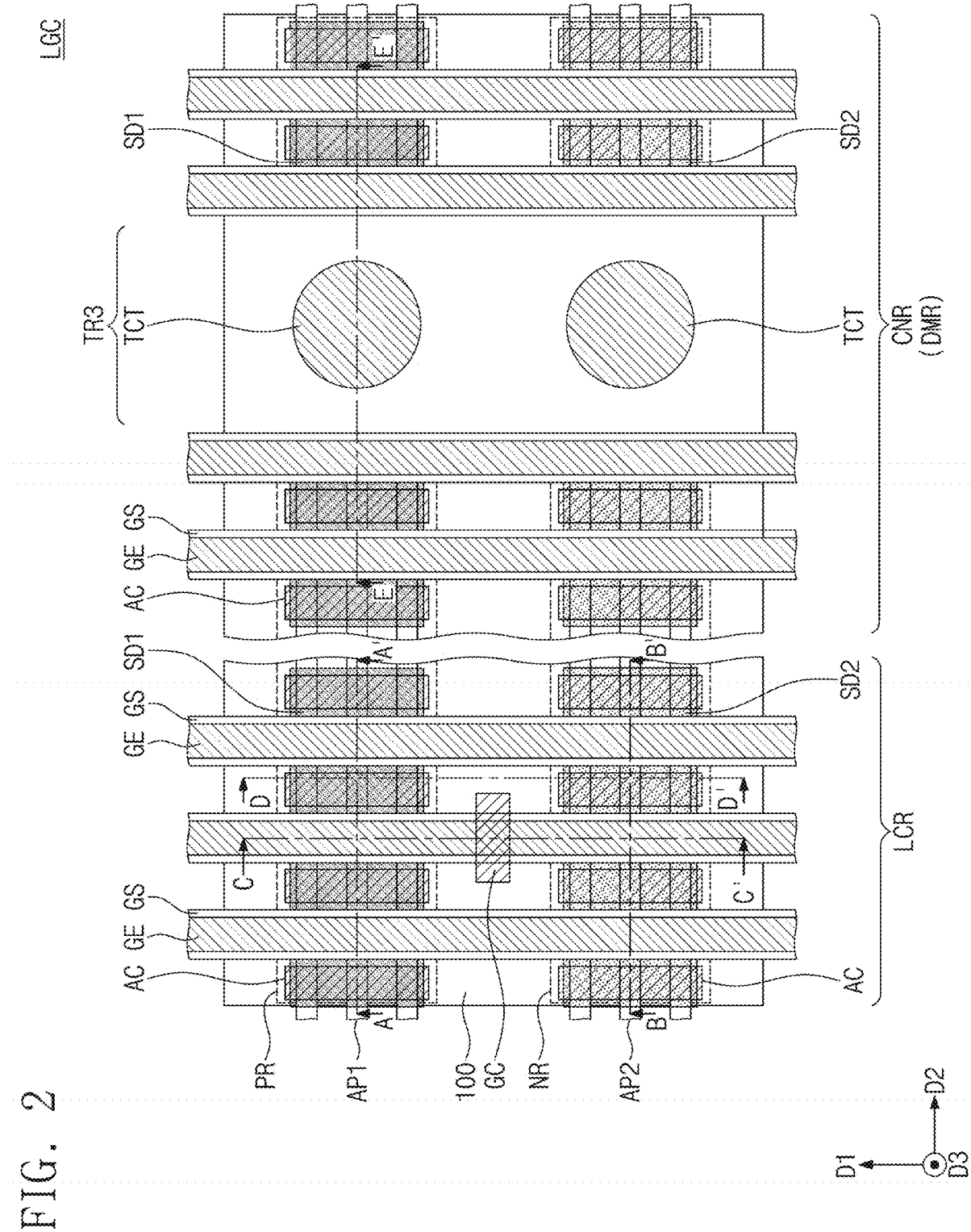
FIG. 2 is an enlarged plan view illustrating a logic cell region and a connection region of FIG. 1.

FIG. 2 is an enlarged plan view illustrating a logic cell region and a connection region of FIG. 1. FIGS. 3A to 3E are sectional views taken along lines A-A', B-B', C-C', D-D', and E-E', respectively, of FIG. 2.

Hereinafter, the logic cell region LCR of the logic chip LGC will be described in more detail with reference to FIGS. 2 and 3A to 3D. The logic cell region LCR may include the logic cell (e.g., the standard cell) constituting the logic circuit. The logic cell region LCR shown in FIG. 2 may be an example of the single logic cell.

The substrate 100 may include a first active region PR and a second active region NR. In some example embodiments, the first active region PR may be a PMOSFET region, and the second active region NR may be an NMOSFET region. The substrate 100 may be a semiconductor substrate that is formed of or includes silicon, germanium, silicon-germanium, a compound semiconductor material, or the like. In some example embodiments, the substrate 100 may be a silicon wafer.

The first and second active regions PR and NR may be defined by a second trench TR2, which is formed in an upper portion of the substrate 100. The second trench TR2 may be positioned between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

First active patterns AP1 and second active patterns AP2 may be provided on the first active region PR and the second active region NR, respectively. The first and second active patterns AP1 and AP2 may extend in the second direction D2 and may be parallel or substantially parallel to each other. The first and second active patterns AP1 and AP2 may be vertically-protruding portions of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. The upper portions of the first and second active patterns AP1 and AP2 may be protruding patterns, which are vertically extended above the device isolation layer ST (e.g., see FIG. 3C). Each of the upper portions of the first and second active patterns AP1 and AP2 may be shaped like a fin. The device isolation layer ST may not cover the upper portions of the first and second active patterns AP1 and AP2. The device isolation layer ST may cover lower portions of side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar or substantially coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor material (e.g., SiGe) having a lattice constant greater than that of the substrate 100. Accordingly, the first source/drain patterns SD1 may exert a compressive stress on the first channel patterns CH1. As an example, the second source/drain patterns SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a constant pitch in the second direction D2. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 3C, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. In other words, the transistor of some example embodiments may be a three-dimensional field-effect transistor (e.g., FinFET), in which the gate electrode GE is provided to three-dimensionally surround the channel patterns CH1 and CH2.

Referring back to FIGS. 2 and 3A to 3D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar or substantially coplanar with a top surface of a first interlayer insulating layer 110, which will be described below. The gate spacers GS may be formed of or include at least one of SiCN, SiCON, or SiN. As another example, the gate spacers GS may include a multi-layer containing at least two of SiCN, SiCON, or SiN.

A gate capping pattern GP may be provided on each of the gate electrodes GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be interposed between the gate electrode GE and the first active pattern AP1 and between the gate electrode GE and the second active pattern AP2. The gate insulating layer GI may be extended along a bottom surface of the gate electrode GE thereon. As an example, the gate insulating layer GI may cover the first top surface TS1 and the first side surfaces SW1 of the first channel pattern CH1. The gate insulating layer GI may cover the second top surface TS2 and both of the second side surfaces SW2 of the second channel pattern CH2. The gate insulating layer GI may cover a top surface of the device isolation layer ST below the gate electrode GE (e.g., see FIG. 3C).

In some example embodiments, the gate insulating layer GI may be formed of or include a high-k dielectric material whose dielectric constant is higher than that of a silicon oxide layer. As an example, the high-k dielectric material may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In some example embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than about 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from about 3 to about 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from about 2 at % to about 10 at %. In the case where the dopants are yttrium (Y), a content of yttrium in the ferroelectric layer may range from about 2 at % to about 10 at %. In the case where the dopants are gadolinium (Gd), a content of gadolinium in the ferroelectric layer may range from about 1 at % to about 7 at %. In the case where the dopants are zirconium (Zr), a content of zirconium in the ferroelectric layer may range from about 50 at % to about 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, when its thickness is in a specific range. In some example embodiments, the ferroelectric layer may have a thickness ranging from 0.5 to 10 nm, but the inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and near the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metallic material, which is selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be coplanar or substantially coplanar with the top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In some example embodiments, at least one of the first to fourth interlayer insulating layers 110-140 may be formed of or include silicon oxide.

Active contacts AC may be provided to penetrate the first and second interlayer insulating layers 110 and 120 and to be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. In some example embodiments, the active contact AC may cover at least a portion of a side surface of the gate spacer GS. Although not shown, the active contact AC may be provided to cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, or cobalt silicide).

The active contact AC may include a conductive pattern FM and a barrier pattern BM surrounding the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include a metal nitride layer or may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

At least one gate contact GC may be provided to penetrate the second interlayer insulating layer 120 and the gate capping pattern GP and to be electrically connected to the gate electrode GE. When viewed in a plan view, the gate contact GC may be disposed between the first active region PR and the second active region NR. The gate contact GC may be disposed on the device isolation layer ST filling the second trench TR2.

The gate contact GC may include a conductive pattern FM and a barrier pattern BM surrounding the conductive pattern FM. The conductive and barrier patterns FM and BM of the gate contact GC may be provided to have substantially the same features as the conductive and barrier patterns FM and BM of the active contact AC, respectively.

Connection patterns CNP may be provided in the third interlayer insulating layer 130. The connection patterns CNP may be provided on the active contacts AC and the gate contact GC, respectively. The connection patterns CNP may connect the active and gate contacts AC and GC to a metal layer, which will be described below. The connection patterns CNP may be provided between the active and gate contacts AC and GC and the metal layer, and in this case, it may be possible to increase a degree of freedom in constructing a routing structure. For example, referring to FIG. 3C, the connection pattern CNP on the gate contact GC may be used to connect the gate contact GC to an interconnection line INL, which is horizontally offset therefrom. In some example embodiments, the connection patterns CNP may be omitted. Although not shown, each of the connection patterns CNP may include a conductive pattern and a barrier pattern. The conductive pattern may be formed of or include a metallic material that is the same as or different from the conductive pattern FM of the active contact AC.

The active and gate contacts AC and GC in the second interlayer insulating layer 120 and the connection patterns CNP in the third interlayer insulating layer 130 may constitute an intermediate connection layer MCL. The intermediate connection layer MCL may electrically connect a first metal layer M1, which will be described below, to the transistors on the substrate 100. The intermediate connection layer MCL may be a layer that is formed by a middle-of-line (MOL) process to be described below.

An etch stop layer ESL may be interposed between the third interlayer insulating layer 130 and the fourth interlayer insulating layer 140. For example, the etch stop layer ESL may include a silicon nitride layer or a silicon oxide layer.

A first metal layer M1 may be provided in the fourth interlayer insulating layer 140. The first metal layer may include interconnection lines INL and vias VI. The interconnection lines INL may be provided in an upper portion of the fourth interlayer insulating layer 140, and the vias VI may be provided in a lower portion of the fourth interlayer insulating layer 140. The vias VI may be provided below the interconnection lines INL, respectively.

For example, the interconnection lines INL may be extended in the second direction D2 to be parallel or substantially parallel to each other. The interconnection lines INL may be arranged at a constant pitch in the first direction D1. The vias VI may be respectively interposed between the interconnection lines INL and the connection patterns CNP to electrically connect them to each other. Each of the vias VI may be provided to penetrate the etch stop layer ESL and to be in contact with a top surface of the connection pattern CNP. The vias VI may be coupled to the intermediate connection layer MCL to connect the interconnection lines INL to the intermediate connection layer MCL.

Although not shown, other metal layers (e.g., a second metal layer, a third metal layer, a fourth metal layer, and so forth) may be additionally stacked on the fourth interlayer insulating layer 140. The stacked metal layers may include routing interconnection lines connecting the logic cells to each other.

Hereinafter, the connection region CNR of the logic chip LGC will be described in more detail with reference to FIGS. 2 and 3E. The connection region CNR may include at least one dummy cell region DMR and at least one penetration contact TCT.

The dummy cell region DMR may have substantially the same structure as the logic cell region LCR described above. In other words, the dummy cell region DMR may include the first active region PR, the second active region NR, and the three-dimensional field effect transistors thereon, like the logic cell region LCR. The active contacts AC, the gate contacts GC, the connection patterns CNP, and the first metal layer M1 may be provided on the dummy cell region DMR in the same manner as those on the logic cell region LCR.

However, unlike the logic cell region LCR, the dummy cell region DMR of the connection region CNR may be a dummy that is not be used to constitute a logic circuit. That is, the transistor on the dummy cell region DMR may be a dummy transistor. In the case where any pattern is not formed on the dummy cell region DMR, the dummy cell region DMR may have a very low pattern density during a photolithography process for forming the logic cell regions LCR, although the dummy cell region DMR does not serve as a substantially effective logic cell. In this case, a process failure may occur in the photolithography process. Thus, the processes for forming the logic cell regions LCR may be performed on the dummy cell region DMR in the same manner.

Referring back to FIG. 1, the penetration contact TCT may be provided at a region that is spaced apart from the logic cell regions LCR by a specific distance. Thus, the penetration contact TCT may be selectively provided in the connection region CNR (e.g., the dummy cell region DMR), except the logic cell regions LCR.

Referring back to FIGS. 2 and 3E, a third trench TR3 may be formed in an upper portion of the substrate 100 to bisect the first active pattern AP1 in the second direction D2. The device isolation layer ST may fill the third trench TR3.

The penetration contact TCT may be provided on the third trench TR3. The penetration contact TCT may penetrate the device isolation layer ST filling the third trench TR3 and the substrate 100 thereunder. In some example embodiments, the penetration contact TCT may be extended into the first metal layer M1.

A top surface TCTt of the penetration contact TCT may be directly connected to a bottom surface of the interconnection line INL of the first metal layer M1. The via VI may be absent between the top surface TCTt of the penetration contact TCT and the interconnection line INL. In other words, the penetration contact TCT may be directly connected to the interconnection line INL without the via VI. The penetration contact TCT may be vertically extended from the bottom surface of the interconnection line INL of the first metal layer M1 to a bottom surface of the substrate 100.

A passivation layer PAV may be provided on the bottom surface of the substrate 100. The passivation layer PAV may enclose an exposed lower portion of the penetration contact TCT. An upper portion of the penetration contact TCT may penetrate the etch stop layer ESL and may protrude above the etch stop layer ESL. A protection insulating pattern PIP may be formed to cover the protruding upper portion of the penetration contact TCT. In detail, the protection insulating pattern PIP may cover an upper side surface TCTu of the penetration contact TCT. The protection insulating pattern PIP may be formed of or include at least one of SiN, SiCN, or SiON.

The top surface TCTt of the penetration contact TCT may be higher than a top surface ESLt of the etch stop layer ESL. The top surface TCTt of the penetration contact TCT may be located at a level between bottom and top surfaces of the fourth interlayer insulating layer 140. The top surface TCTt of the penetration contact TCT may be located at substantially the same level as the top surface of the via VI. The protection insulating pattern PIP may partially cover a top surface of the etch stop layer ESL adjacent to the penetration contact TCT. The protection insulating pattern PIP may be extended from the top surface of the etch stop layer ESL to the bottom surface of the interconnection line INL. The etch stop layer ESL under the protection insulating pattern PIP may cover at least a portion of the upper side surface TCTu of the penetration contact TCT.

The penetration contact TCT may include a conductive pattern FM and the barrier pattern BM and an insulating spacer SPC, which are provided to surround the conductive pattern FM. The conductive pattern FM may be shaped like a vertically-extended pillar. The barrier pattern BM may be provided to cover or enclose an outer side surface of the conductive pattern FM. The barrier pattern BM may expose top and bottom surfaces of the conductive pattern FM. The insulating spacer SPC may be provided to cover or enclose an outer side surface of the barrier pattern BM.

The conductive pattern FM may be formed of or include at least one metal of aluminum, copper, tungsten, molybdenum, or cobalt. The barrier pattern BM may include a metal nitride layer or may include a metal layer and a metal nitride layer. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Figure 3A:
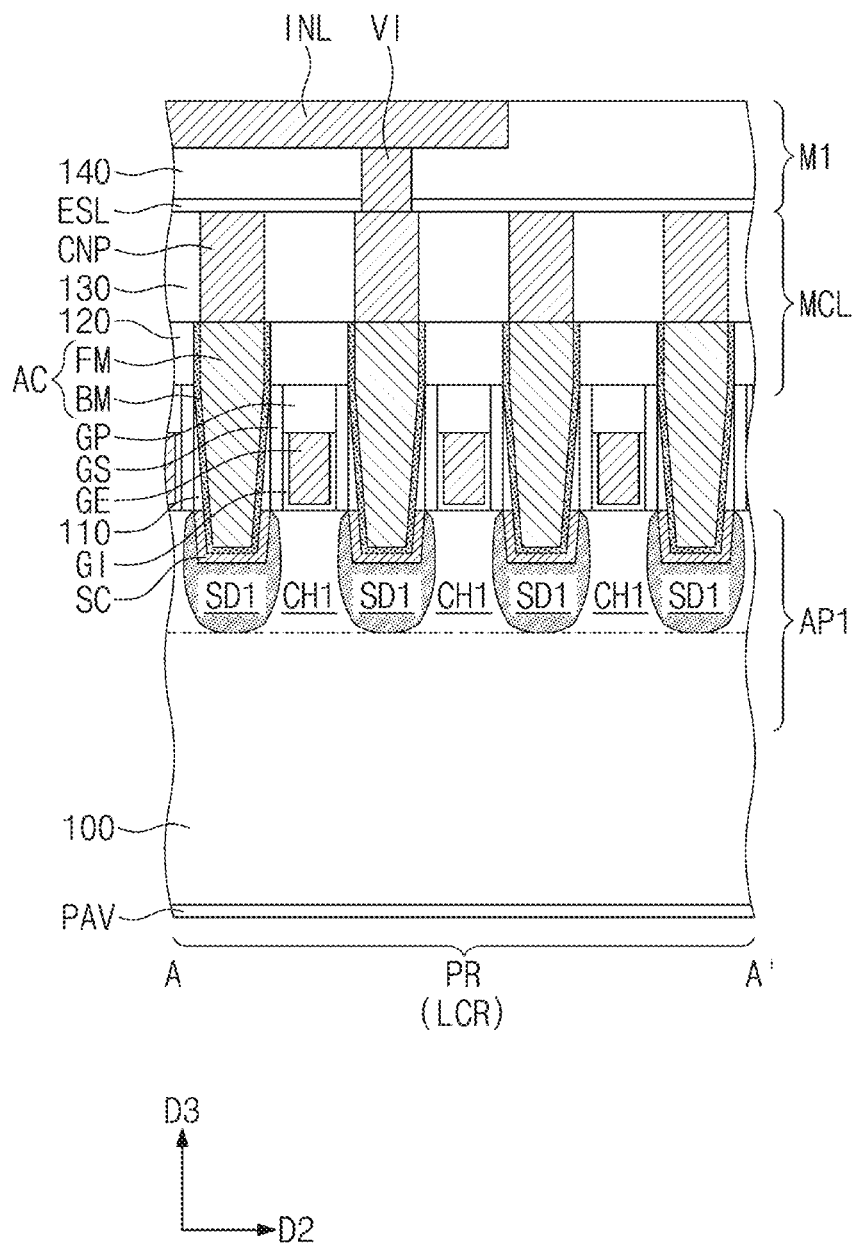
FIGS. 3A to 3E are sectional views taken along lines A-A', B-B', C-C', D-D', and E-E', respectively, of FIG. 2.
Figure 3B:
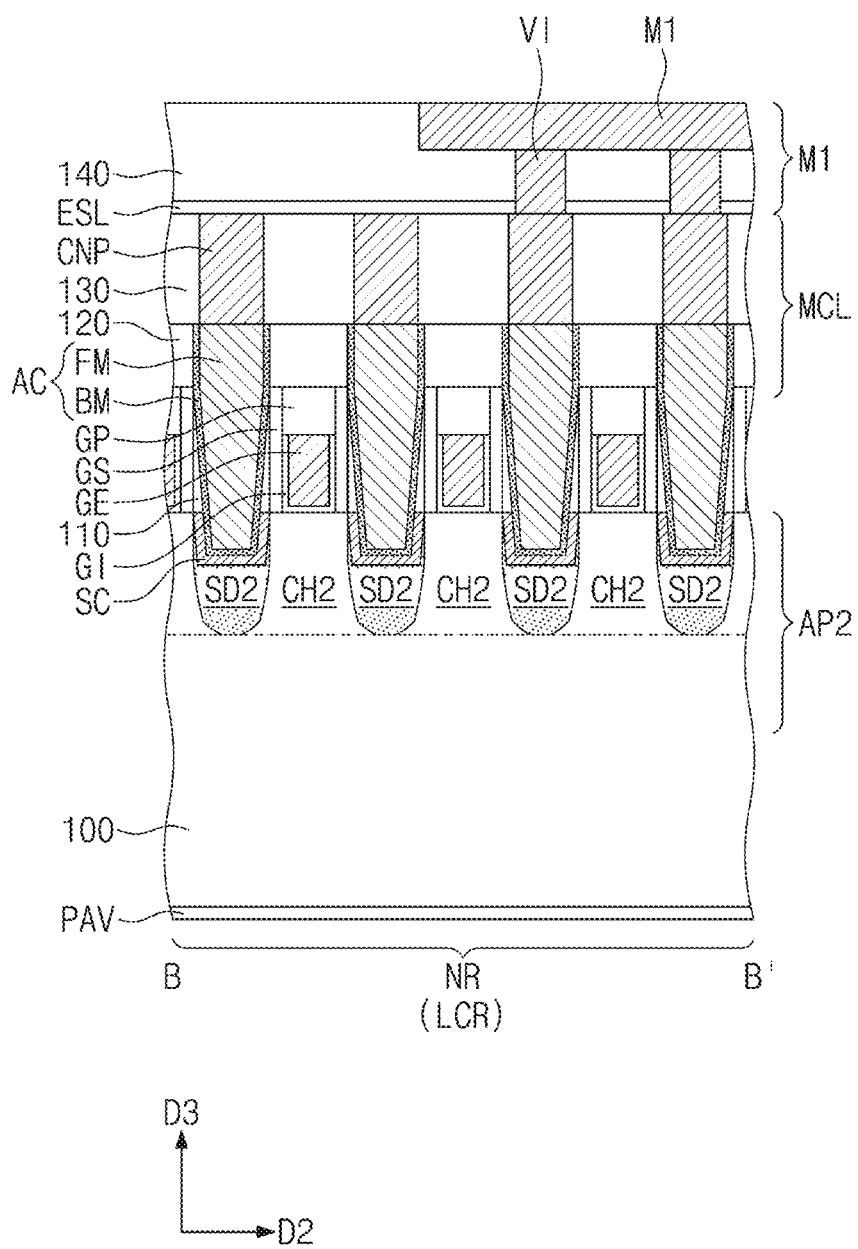
Figure 3C:
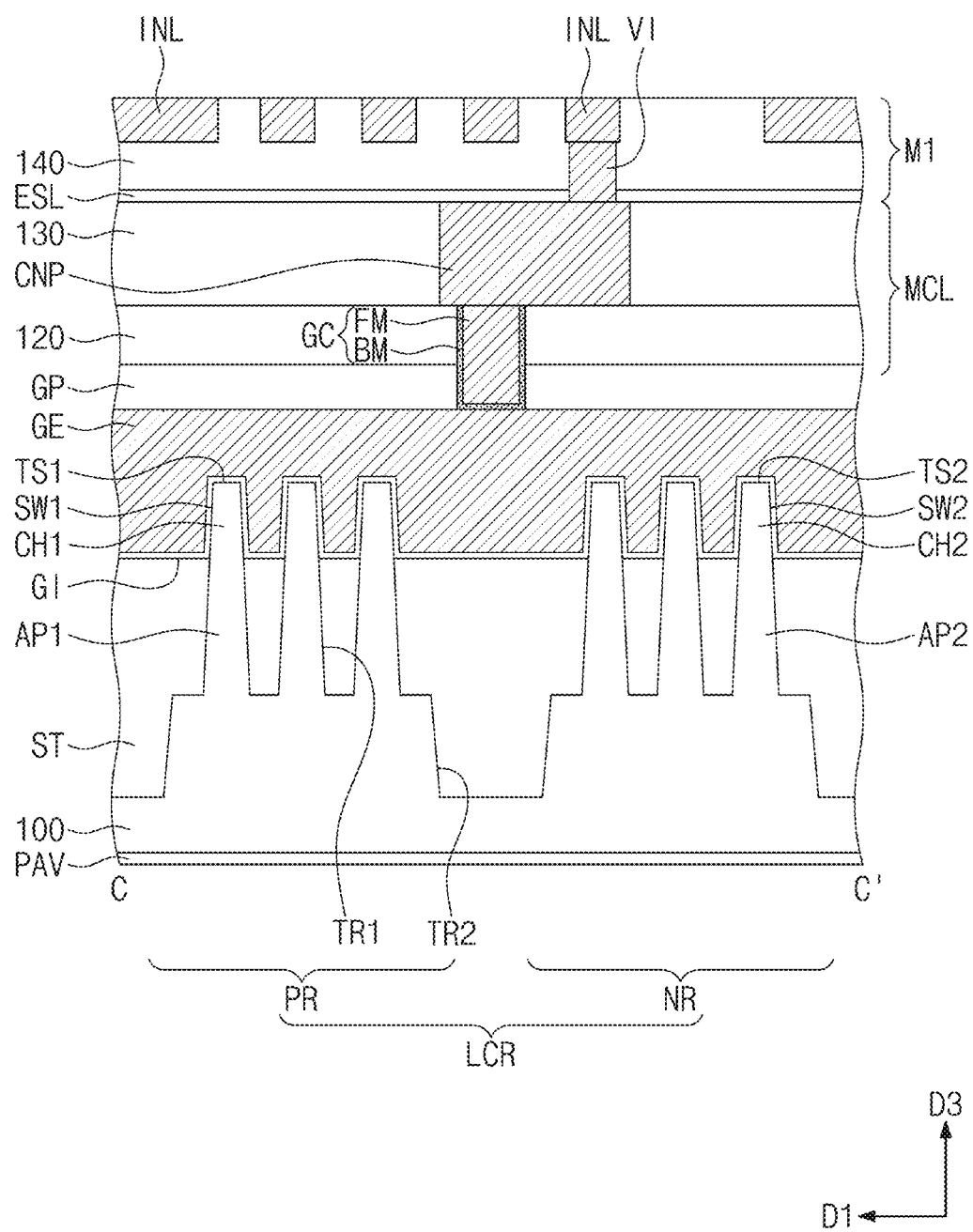
Figure 3D:
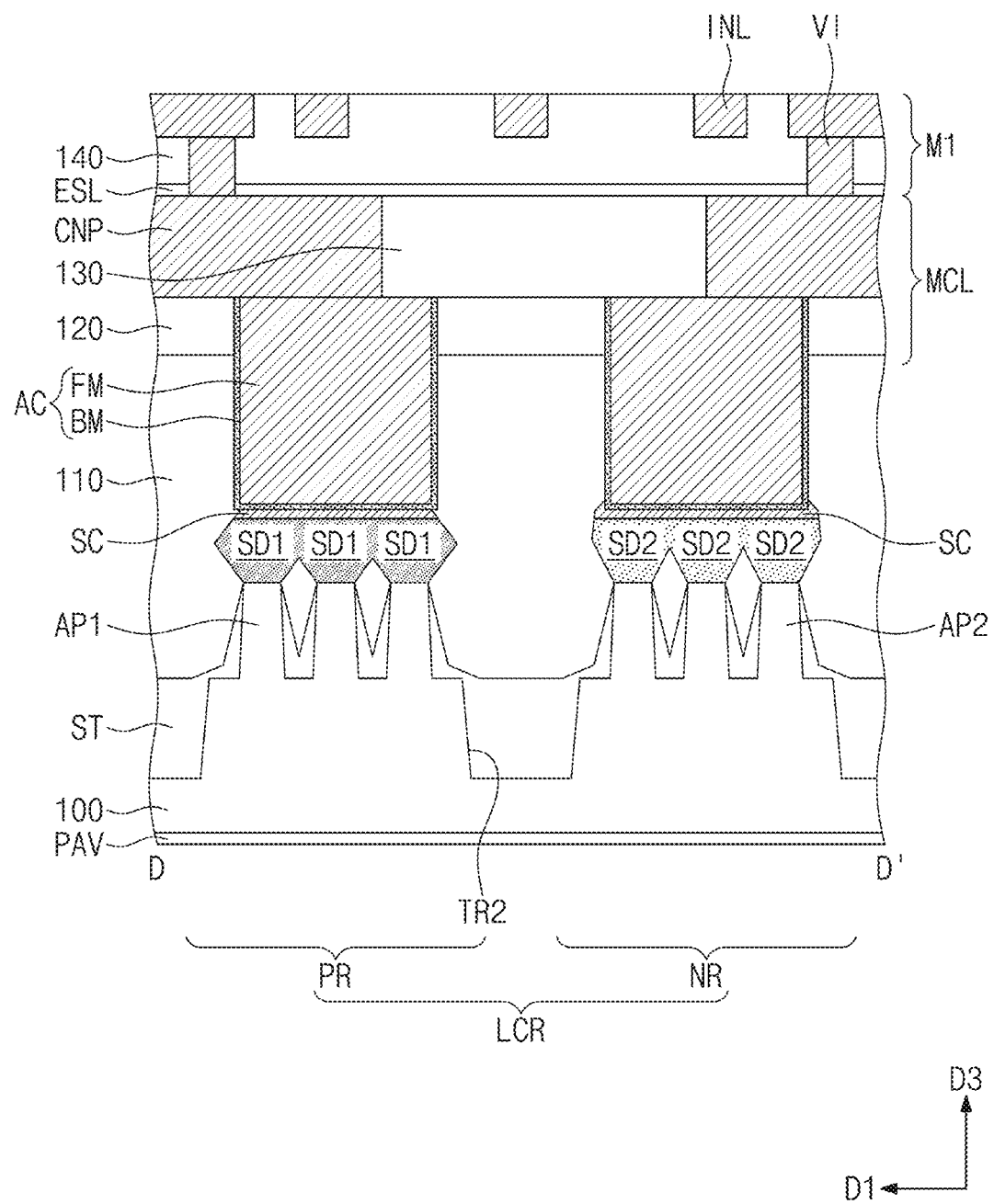
Figure 3E:
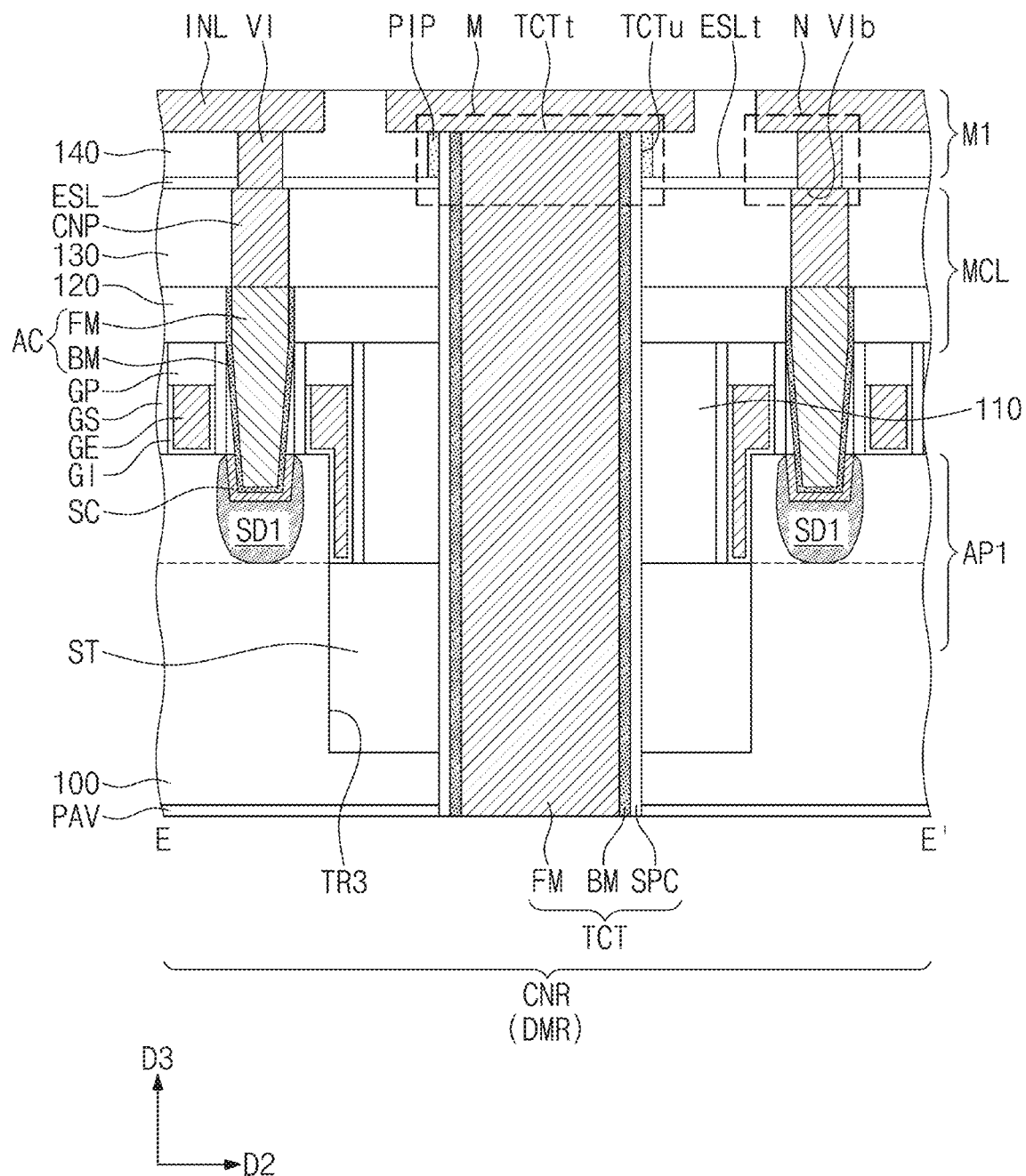
Figure 4:
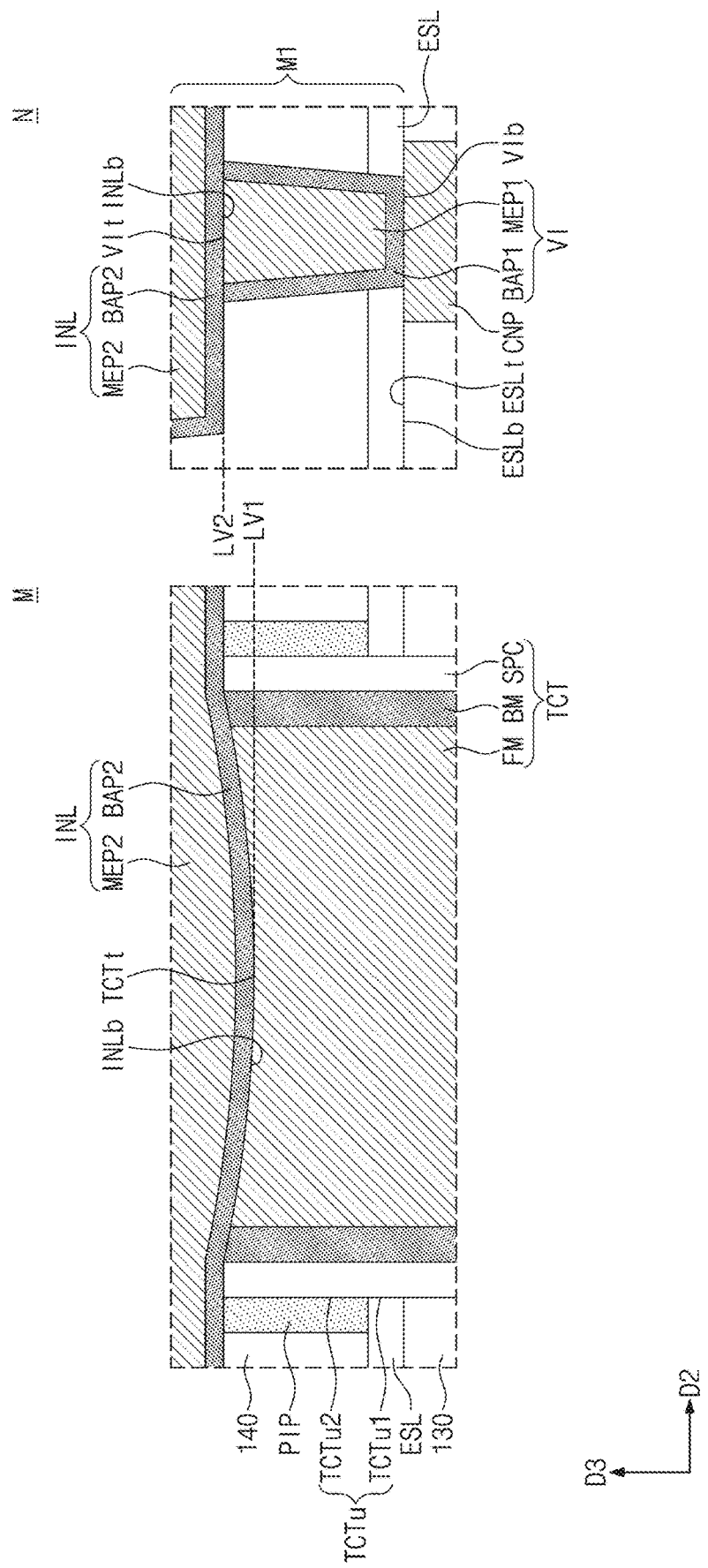
FIG. 4 is an enlarged sectional view illustrating regions M and N of FIG. 3E.
Figure 5:
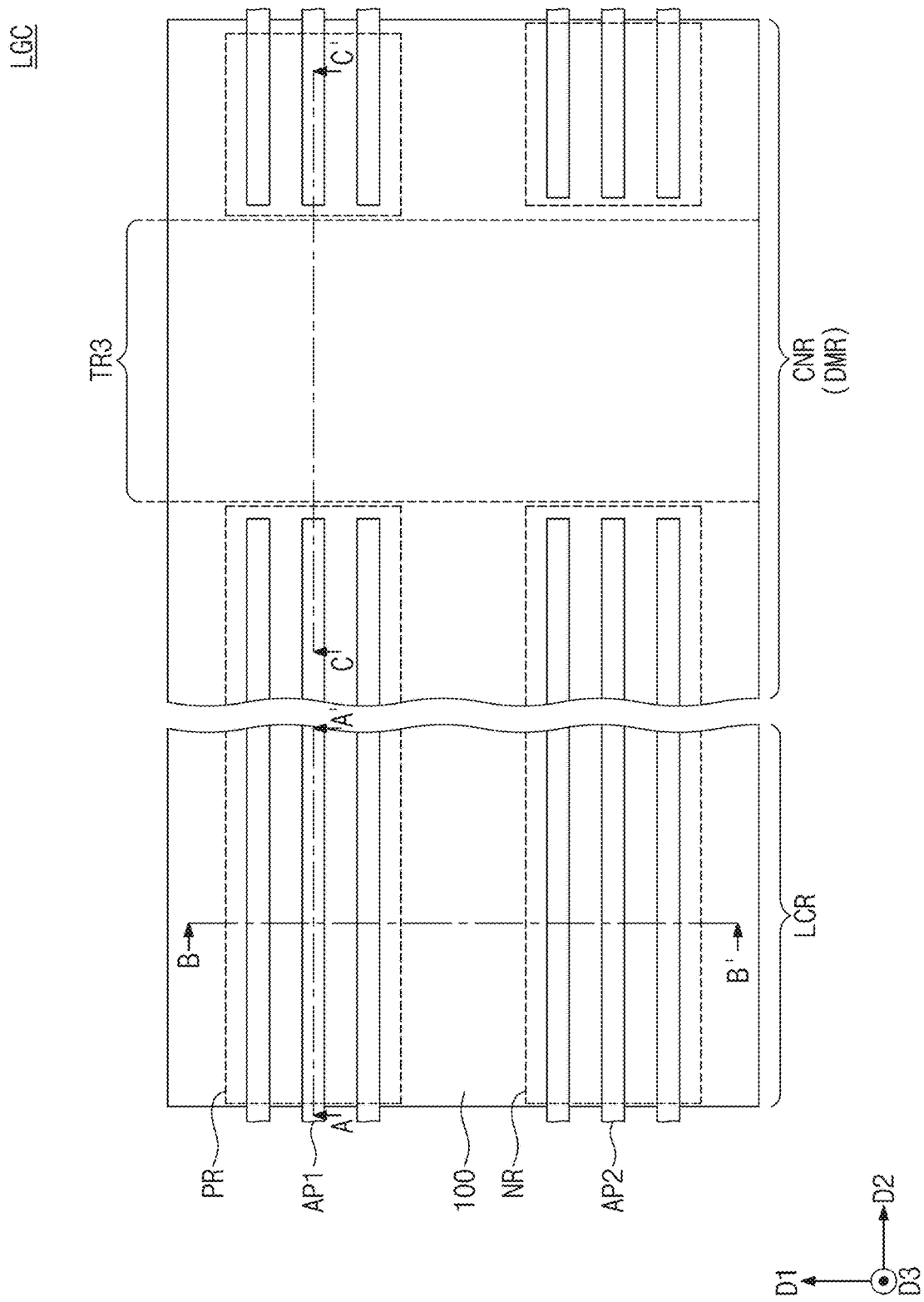
FIGS. 5, 7, 9, and 11 are plan views illustrating a method of fabricating a semiconductor device according to some example embodiments of the inventive concepts.
Figure 6A:
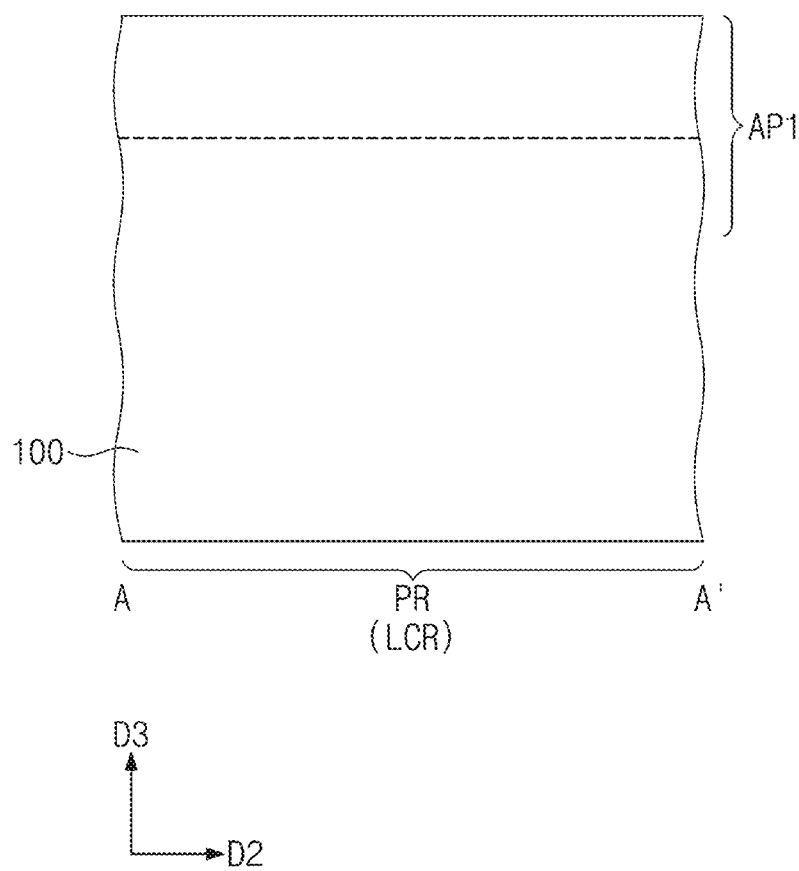
FIGS. 6A, 8A, 10A, and 12A are sectional views taken along lines A-A' of FIGS. 5, 7, 9, and 11, respectively.
Figure 6B:
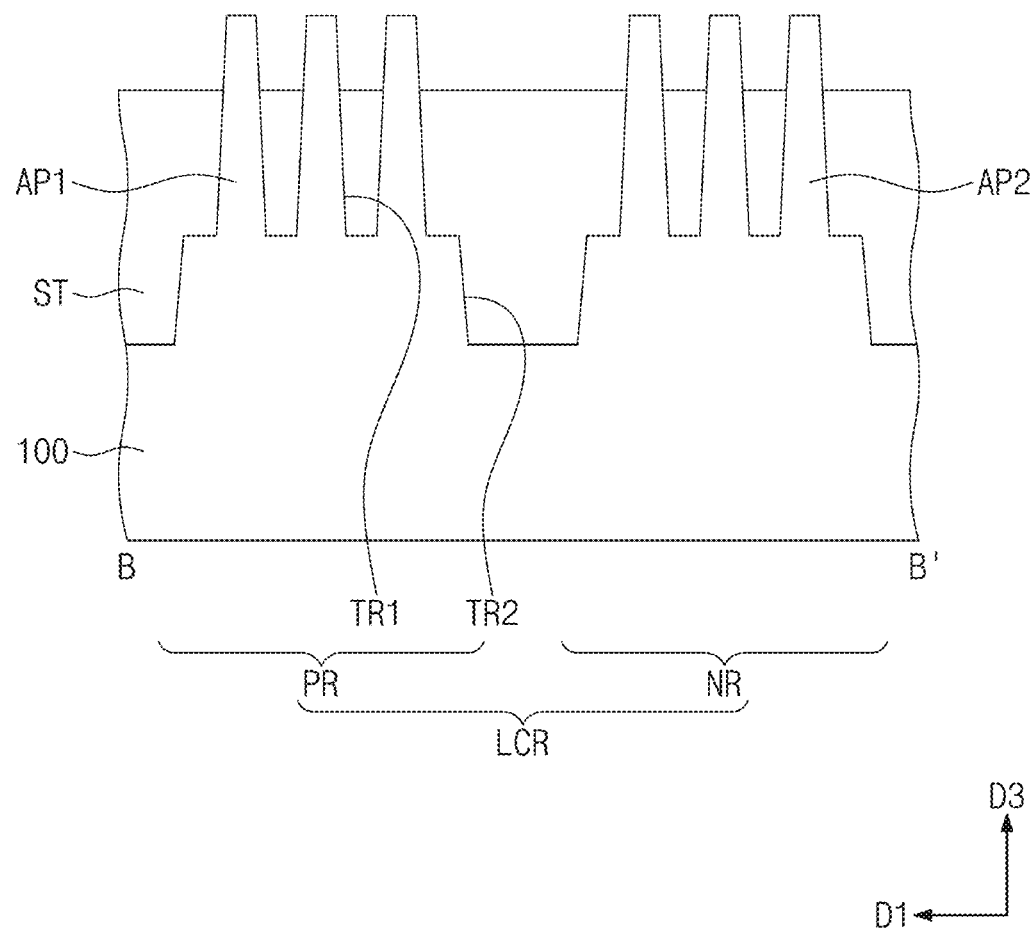
FIGS. 6B, 8B, 10B, and 12B are sectional views taken along lines B-B' of FIGS. 5, 7, 9, and 11, respectively.
Figure 6C:
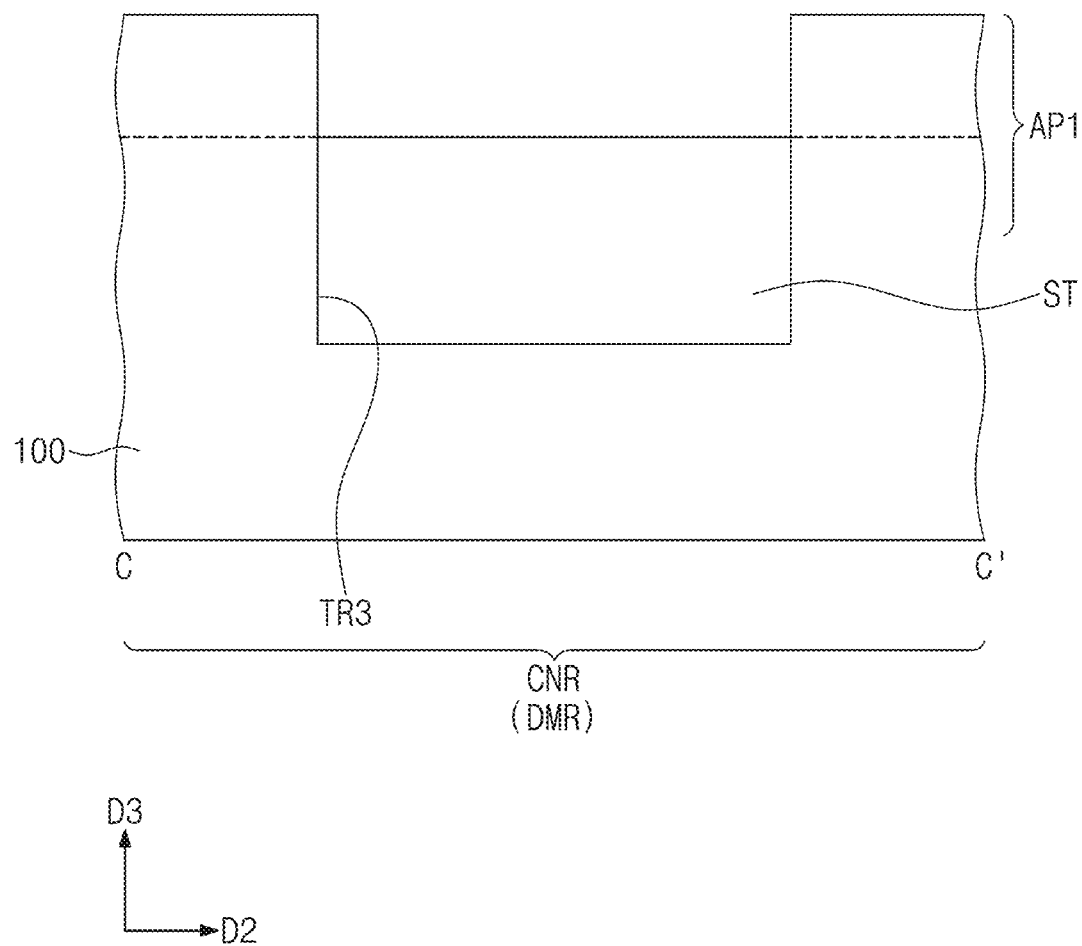
FIGS. 6C, 8C, 10C, and 12C are sectional views taken along lines C-C' of FIGS. 5, 7, 9, and 11, respectively.
Figure 7:
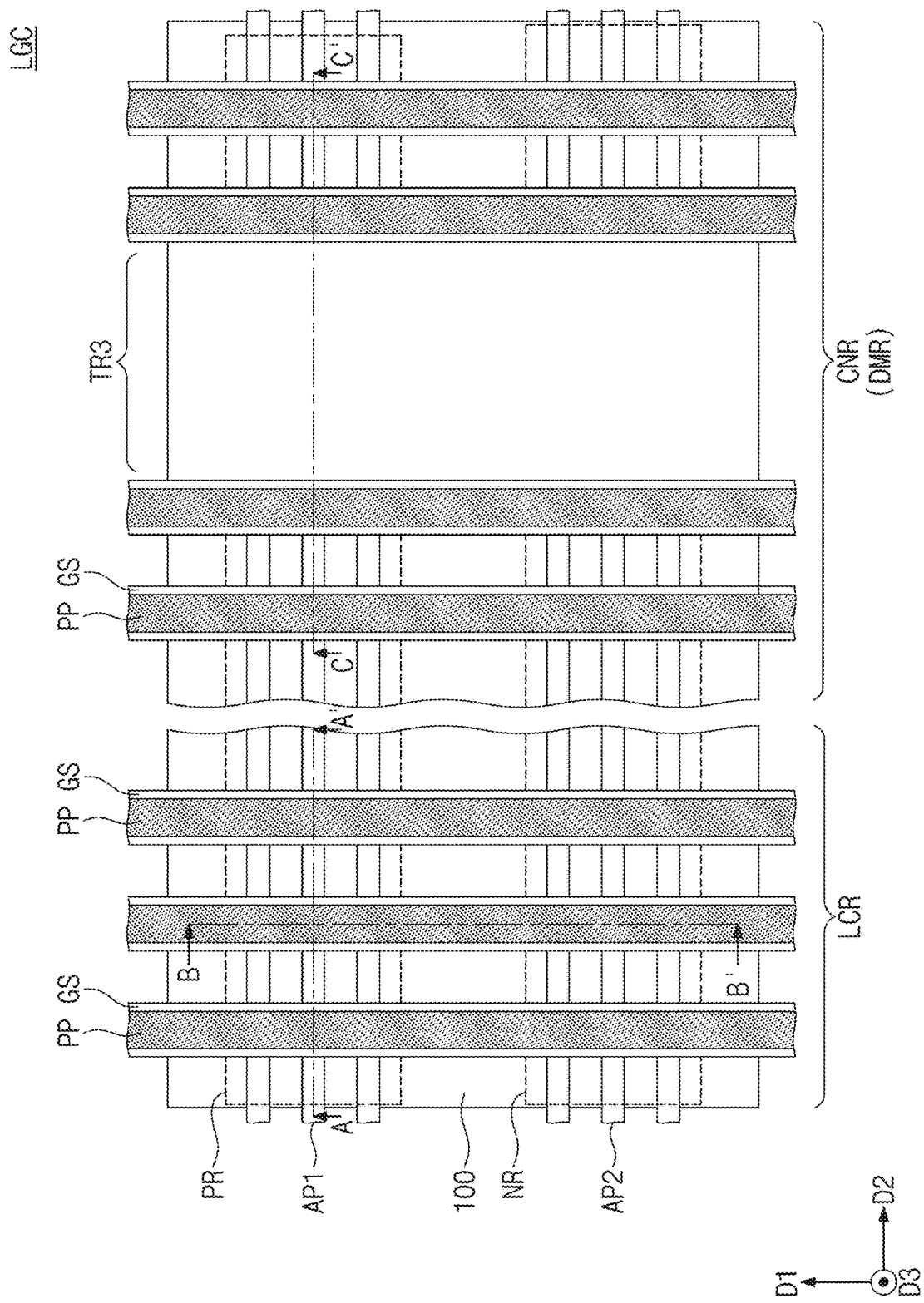
Figure 8A:
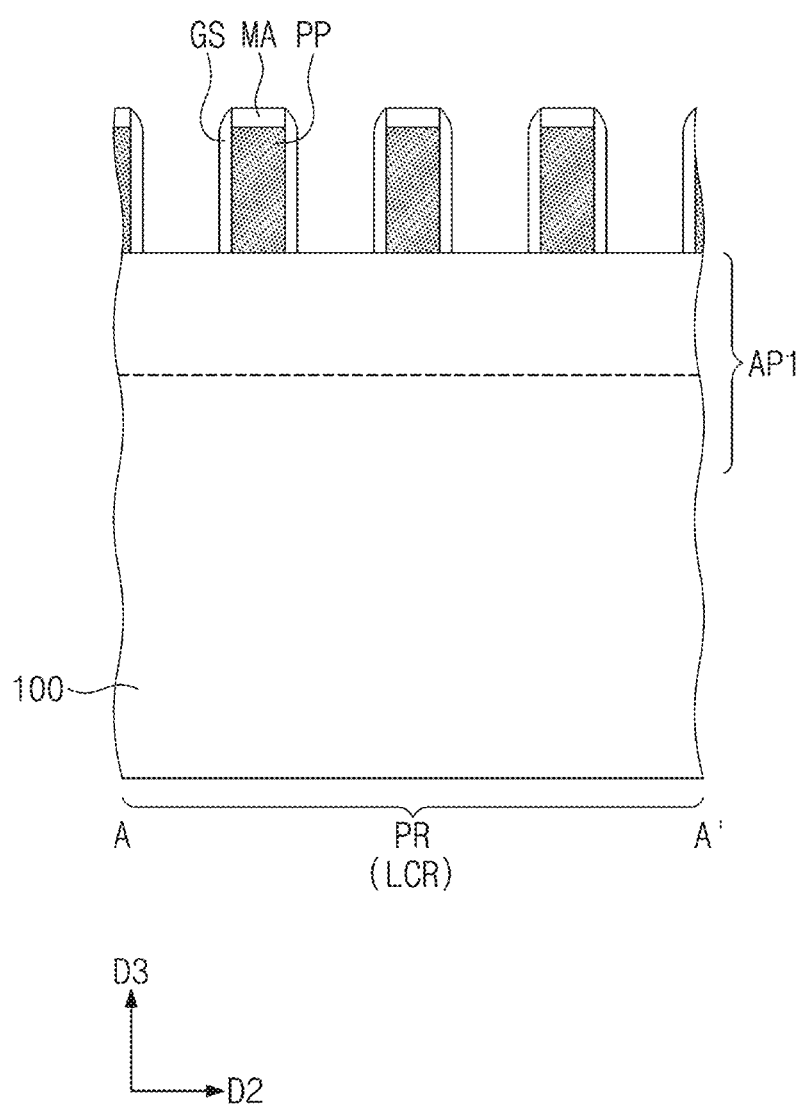
Figure 8B:
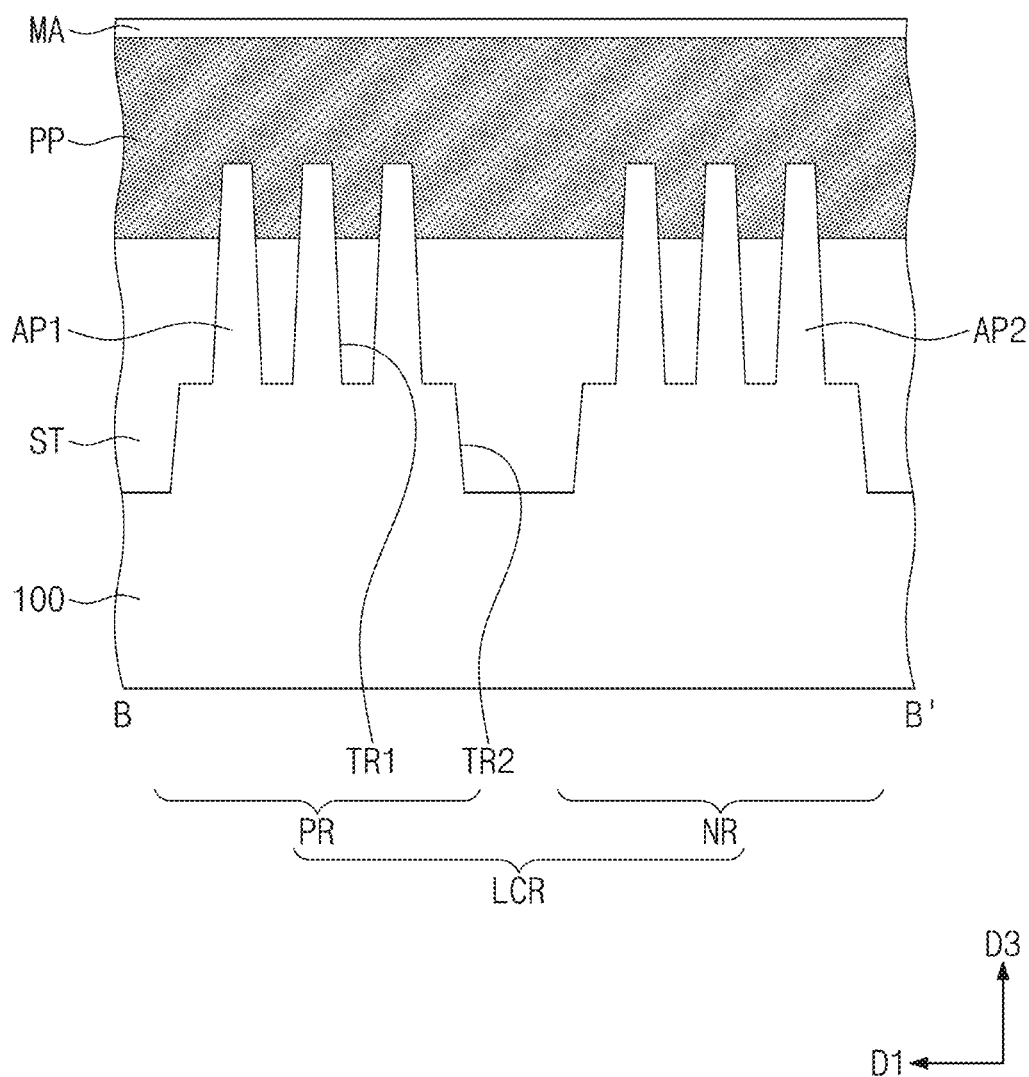
Figure 8C:
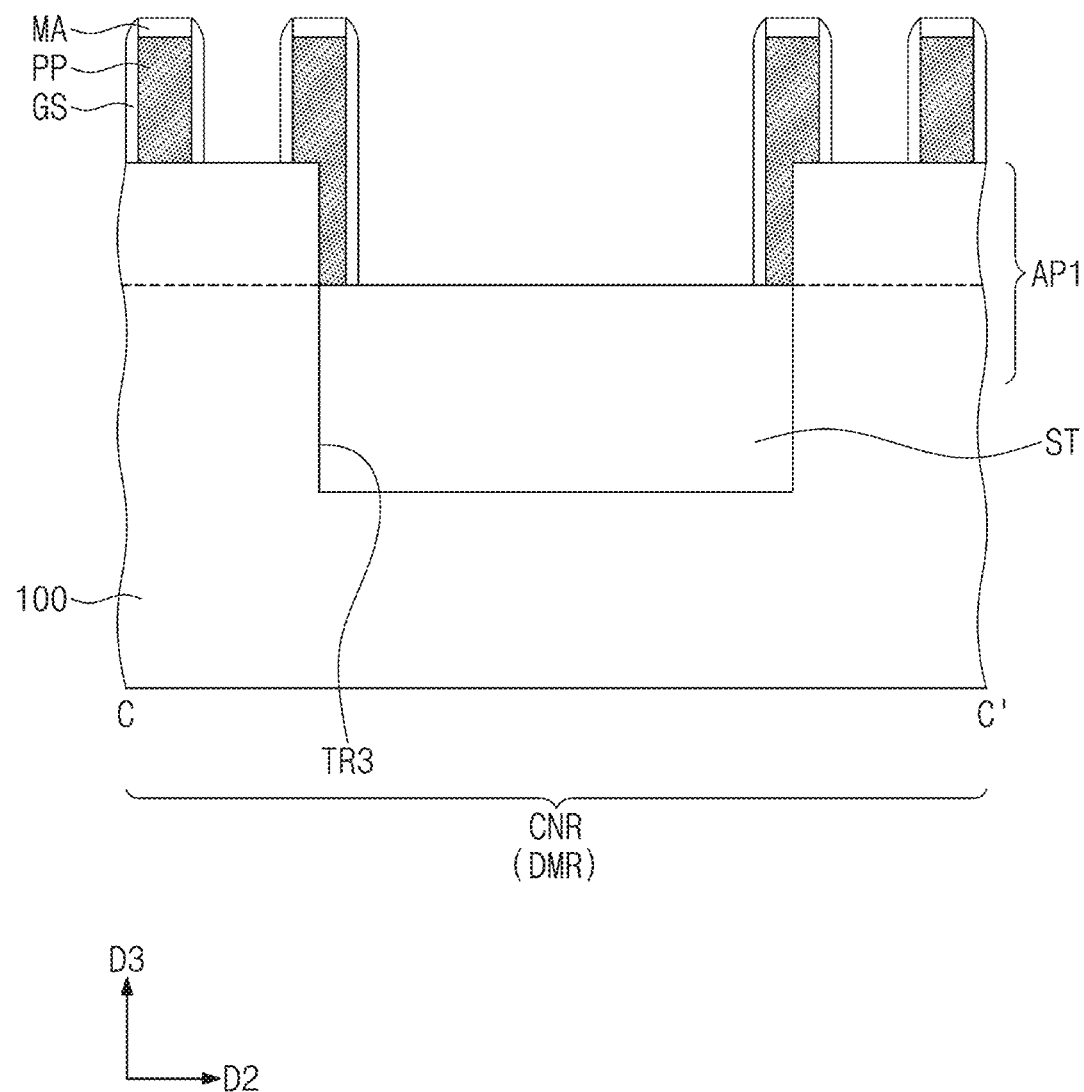
Figure 9:
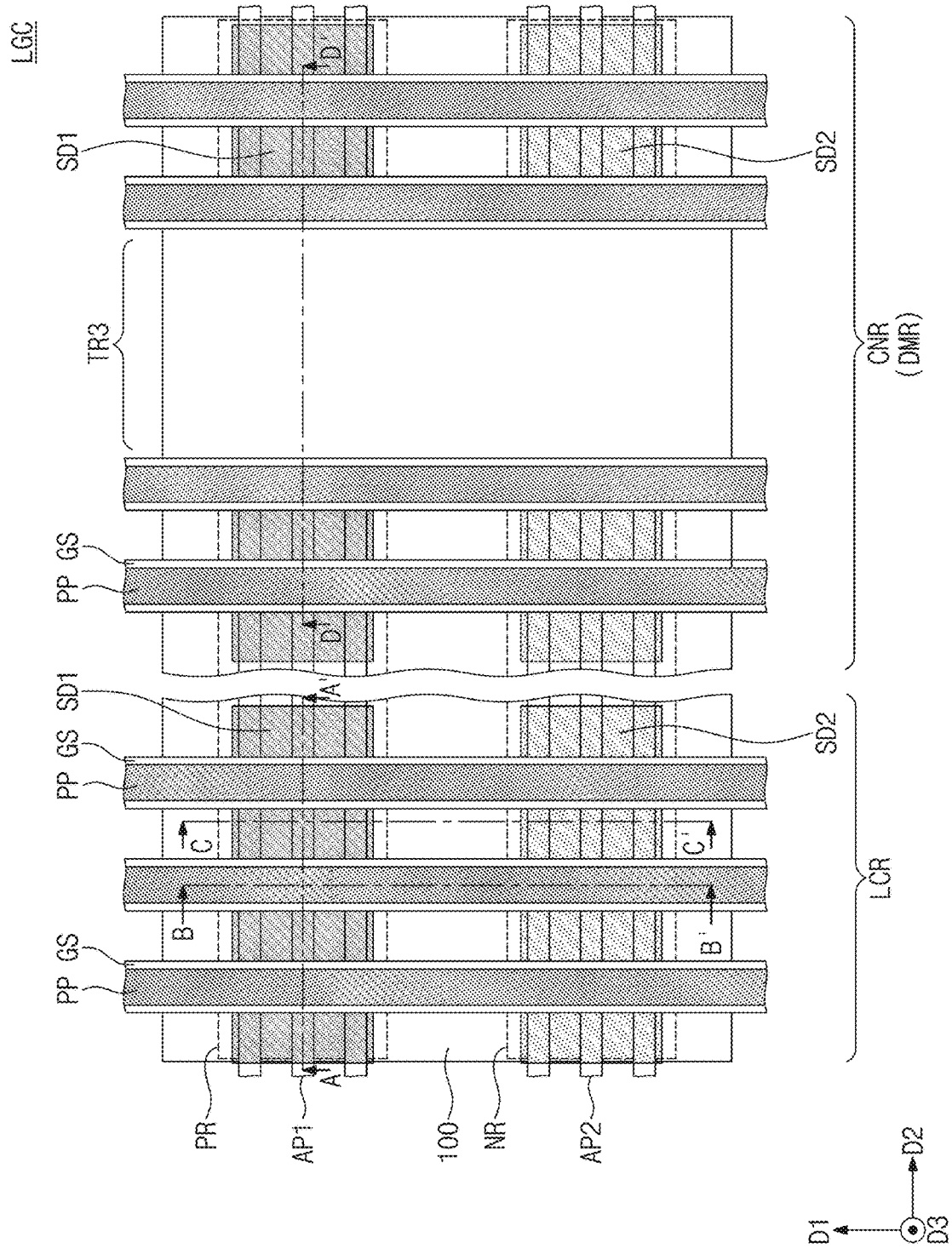

FIG. 4 is an enlarged sectional view illustrating regions M and N of FIG. 3E. Referring to FIG. 4, the via VI of the first metal layer M1 may include a first barrier metal pattern BAP1 and a first metal pattern MEP1 on the first barrier metal pattern BAP1. The interconnection line INL of the first metal layer M1 may include a second barrier metal pattern BAP2 and a second metal pattern MEP2 on the second barrier metal pattern BAP2.

Each of the first and second barrier metal patterns BAP1 and BAP2 may be configured to improve an adhesion property between a corresponding one of the metal patterns MEP1 and MEP2 and the fourth interlayer insulating layer 140. Each of the first and second barrier metal patterns BAP1 and BAP2 may be used as a barrier preventing or reducing metallic elements in the corresponding one of the metal patterns MEP1 and MEP2 from being diffused into the fourth interlayer insulating layer 140. Each of the first and second barrier metal patterns BAP1 and BAP2 may be formed of or include at least one of tantalum nitride (TaN), titanium nitride (TiN), tantalum oxide (TaO), titanium oxide (TiO), manganese nitride (MnN), or manganese oxide (MnO).

In some example embodiments, each of the first and second metal patterns MEP1 and MEP2 may be formed of or include a metallic material selected from the group consisting of copper (Cu), aluminum (Al), ruthenium (Ru), cobalt (Co), tungsten (W), molybdenum (Mo), Al binary alloys, Mo binary alloys, Ru binary alloys, Ni binary alloys, and combinations thereof.

The via VI and the interconnection line INL of the first metal layer M1 may be formed by respective damascene processes. For example, the via VI and the interconnection line INL of the first metal layer M1 may be independently formed by respective single damascene processes.

A bottom surface VIb of the via VI may be in contact with a top surface of the intermediate connection layer MCL (e.g., the top surface of the connection pattern CNP). The bottom surface VIb of the via VI may be substantially coplanar or substantially coplanar with a bottom surface ESLb of the etch stop layer ESL. A top surface VIt of the via VI may be in direct contact with a bottom surface INLb of the interconnection line INL.

The upper side surface TCTu of the penetration contact TCT may include a first upper side surface TCTu1 and a second upper side surface TCTu2 on the first upper side surface TCTu1. The etch stop layer ESL may cover the first upper side surface TCTu1. The protection insulating pattern PIP may cover the second upper side surface TCTu2. The protection insulating pattern PIP may be extended from the top surface ESLt of the etch stop layer ESL along the second upper side surface TCTu2 in a third direction D3.

The top surface TCTt of the penetration contact TCT may be recessed. The top surface TCTt of the penetration contact TCT may have a rounded shape. The top surface TCTt of the penetration contact TCT may be recessed by a dishing phenomenon caused by a planarization process, which will be described below. The bottom surface INLb of the interconnection line INL on the penetration contact TCT may be in direct contact with the recessed top surface TCTt of the penetration contact TCT. Due to the recessed profile of the top surface TCTt of the penetration contact TCT, the bottom surface INLb of the interconnection line INL may have a downward convex shape.

The lowermost level of the bottom surface INLb of the interconnection line INL on the penetration contact TCT may be located at a first level LV1. By contrast, the lowermost level of the bottom surface INLb of the interconnection line INL on the via VI may be located at a second level LV2. In some example embodiments, the first level LV1 may be lower than the second level LV2.

Since the interconnection line INL on the penetration contact TCT is directly connected to the top surface TCTt of the penetration contact TCT without the via VI, an electrical resistance between the penetration contact TCT and the interconnection line INL may be reduced to a relatively very small value. Furthermore, since the top surface TCTt of the penetration contact TCT has a non-flat (e.g., recessed) shape, a contact area between the top surface TCTt of the penetration contact TCT and the bottom surface INLb of the interconnection line INL may be increased. This may make it possible to further reduce the electrical resistance between the penetration contact TCT and the interconnection line INL. In other words, according to some example embodiments of the inventive concepts, it may be possible to reduce an electrical resistance between the penetration contact TCT and the interconnection line INL to a very small value and to improve electric characteristics of the semiconductor device.

Figure 12A:
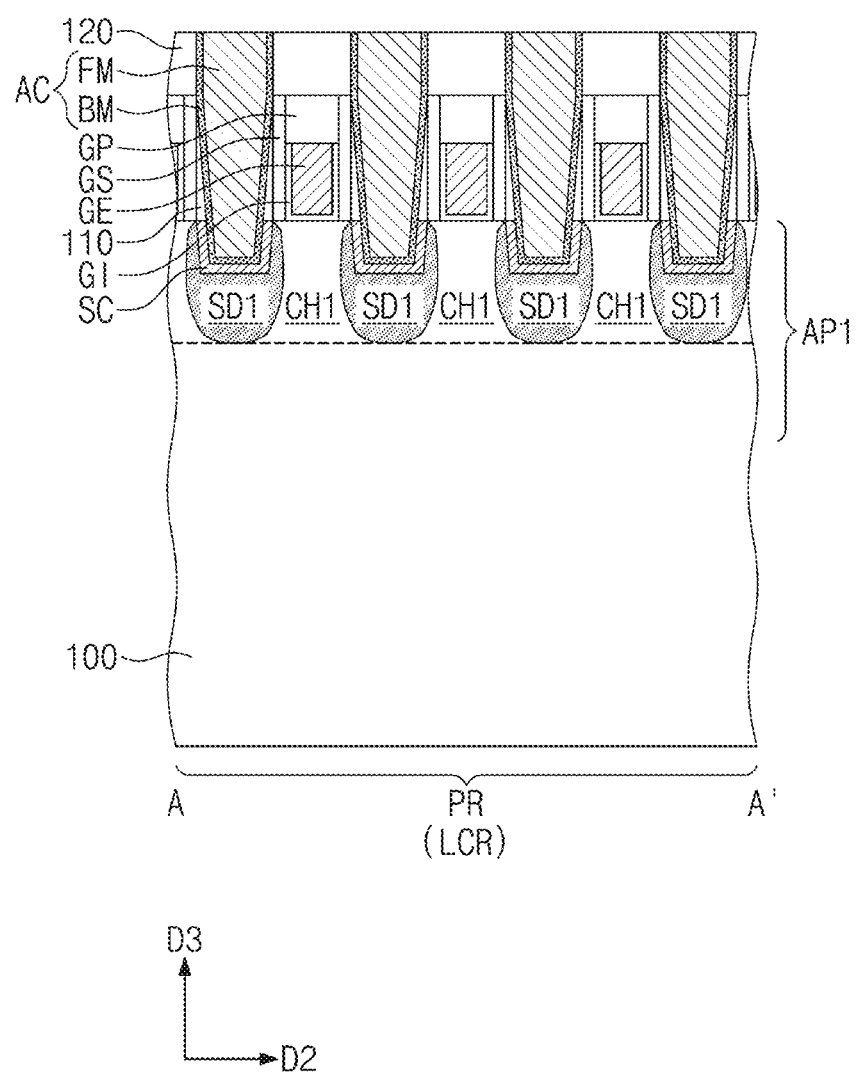
Figure 12B:
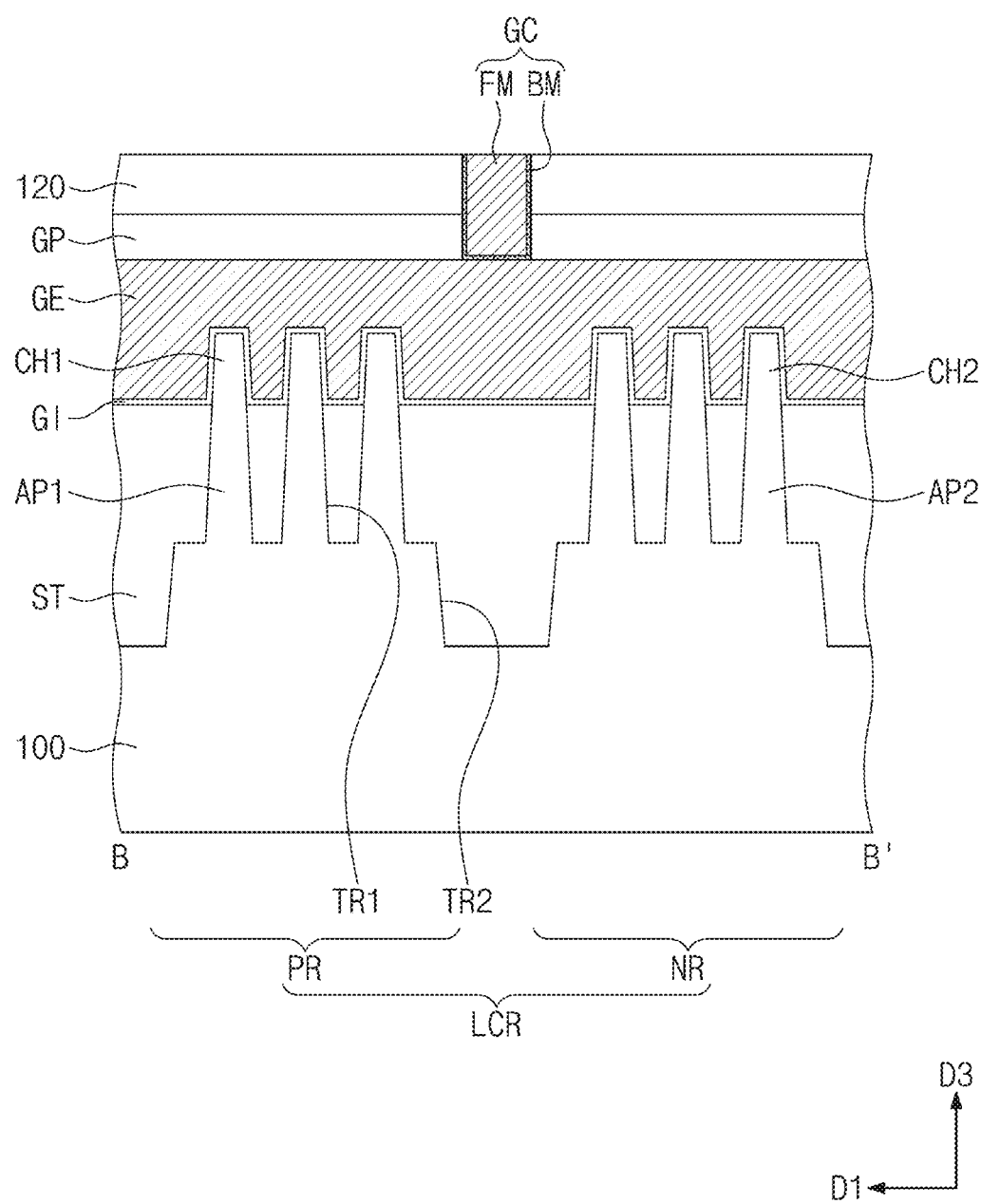
Figure 12C:
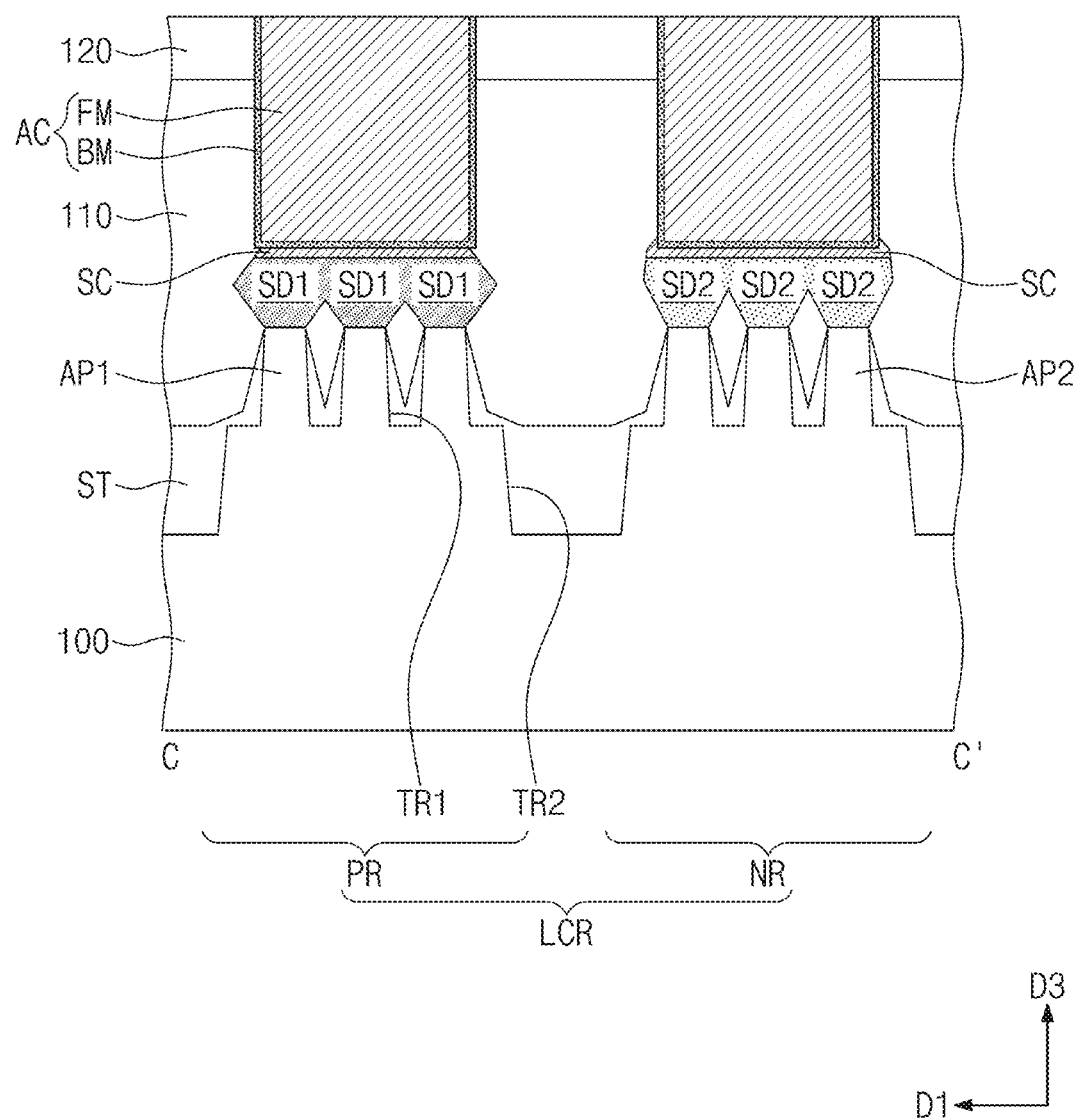
Figure 12D:
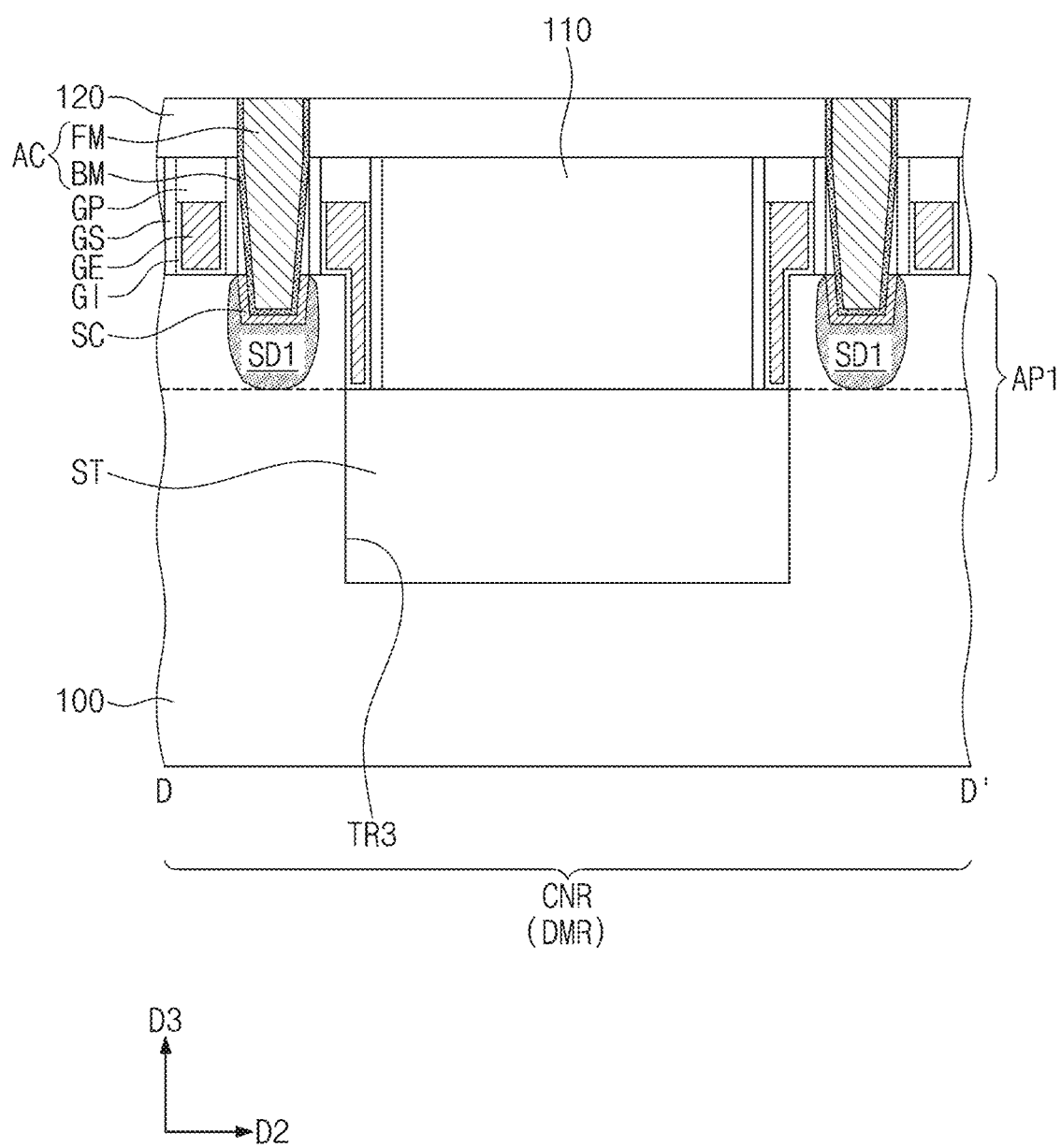

FIGS. 5, 7, 9, and 11 are plan views illustrating a method of fabricating a semiconductor device according to some example embodiments of the inventive concepts. FIGS. 6A, 8A, 10A, and 12A are sectional views taken along lines A-A' of FIGS. 5, 7, 9, and 11, respectively. FIGS. 6B, 8B, 10B, and 12B are sectional views taken along lines B-B' of FIGS. 5, 7, 9, and 11, respectively. FIGS. 6C, 8C, 10C, and 12C are sectional views taken along lines C-C' of FIGS. 5, 7, 9, and 11, respectively. FIGS. 10D and 12D are sectional views taken along lines D-D' of FIGS. 9 and 11, respectively.

Referring to FIGS. 5 and 6A to 6C, the substrate 100 with the logic cell region LCR and the connection region CNR may be provided. Here, the logic cell region LCR may include the first active region PR and the second active region NR.

The substrate 100 may be patterned to form the first and second active patterns AP1 and AP2. The first and second active patterns AP1 and AP2 may be formed on the logic cell region LCR and the connection region CNR. In detail, the first active patterns AP1 may be formed on the first active region PR of the logic cell region LCR, and the second active patterns AP2 may be formed on the second active region NR of the logic cell region LCR.

The first trench TR1 may be formed between the first active patterns AP1 and between the second active patterns AP2. The first trench TR1 may be extended parallel or substantially parallel to the first and second active patterns AP1 and AP2 and in the second direction D2. The substrate 100 may be patterned to form the second trench TR2 between the first and second active regions PR and NR of the logic cell region LCR. The second trench TR2 may be extended in the second direction D2. The second trench TR2 may be formed to be deeper than the first trench TR1. In other words, the second trench TR2 may have a lower bottom surface than a bottom surface of the first trench TF1.

The substrate 100 may be patterned to form the third trench TR3 crossing the connection region CNR. The third trench TR3 may be extended in the first direction D1. Thus, each of the first and second active patterns AP1 and AP2 may be bisected by the third trench TR3. The third trench TR3 may be formed to have a depth that is equal or substantially equal to or larger than a depth of the second trench TR2. In other words, the third trench TR3 may have a bottom surface that is at coplanar or substantially coplanar or lower than a bottom surface of the second trench TF2.

The device isolation layer ST may be formed on the substrate 100 to fill the first to third trenches TR1, TR2, and TR3. The device isolation layer ST may be formed of or include at least one of insulating materials (e.g., silicon oxide). The device isolation layer ST may be recessed to expose upper portions of the first and second active patterns AP1 and AP2. For example, the upper portions of the first and second active patterns AP1 and AP2 may protrude vertically above the device isolation layer ST.

Referring to FIGS. 7 and 8A to 8C, sacrificial patterns PP may be formed to cross the first and second active patterns AP1 and AP2. The sacrificial patterns PP may be line- or bar-shaped patterns extending in the first direction D1. In detail, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include poly silicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be provided to have a multi-layered structure including at least two of SiCN, SiCON, or SiN.

Referring to FIGS. 9 and 10A to 10D, the first source/drain patterns SD1 may be formed in an upper portion of the first active pattern AP1. A pair of the first source/drain patterns SD1 may be formed at both sides of each of the sacrificial patterns PP.

In detail, first recess regions RSR1 may be formed by etching the upper portion of the first active pattern AP1 using the hard mask patterns MA and the gate spacers GS as an etch mask. The device isolation layer ST between the first active patterns AP1 may be recessed during the etching of the upper portion of the first active pattern AP1 (e.g., see FIG. 10C).

The first source/drain pattern SD1 may be formed by performing a selective epitaxial growth process using an inner surface of the first recess region RSR1 of the first active pattern AP1 as a seed layer. As a result of the formation of the first source/drain patterns SD1, the first channel pattern CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the substrate 100. Each of the first source/drain patterns SD1 may be provided to have a multi-layered structure including a plurality of semiconductor layers.

In some example embodiments, the first source/drain patterns SD1 may be doped in situ during a selective epitaxial growth process. In some example embodiments, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

Figure 10A:
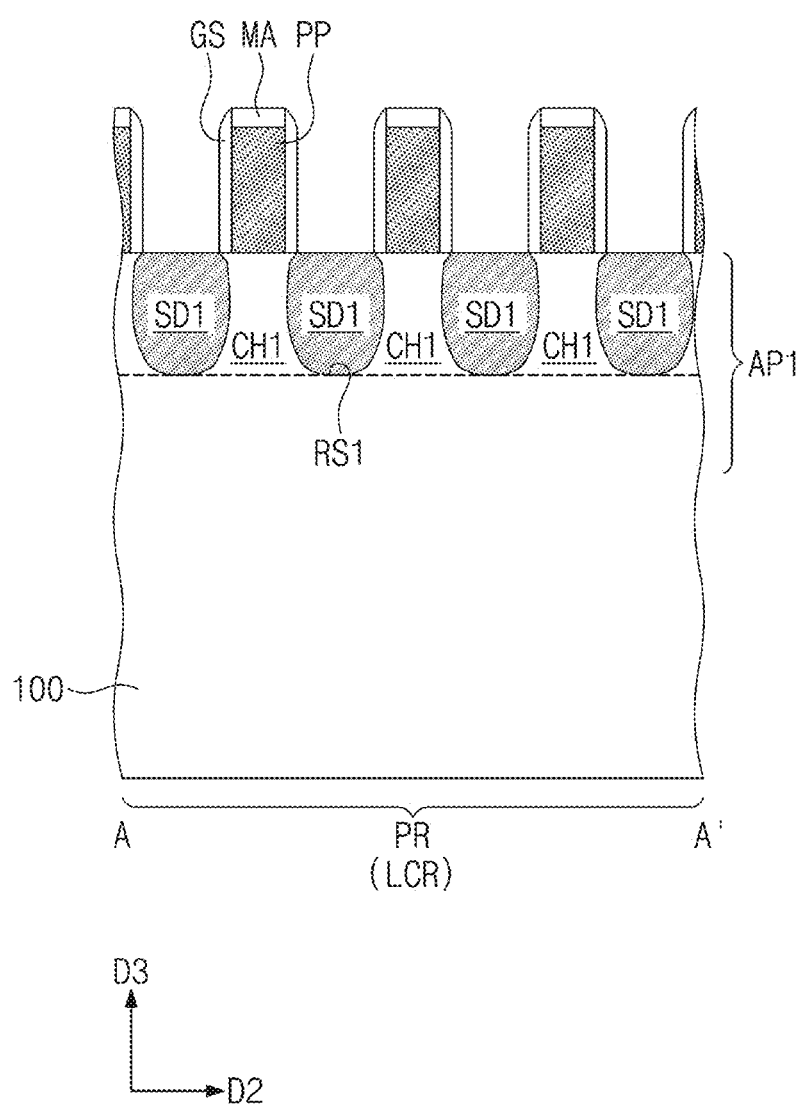
Figure 10B:
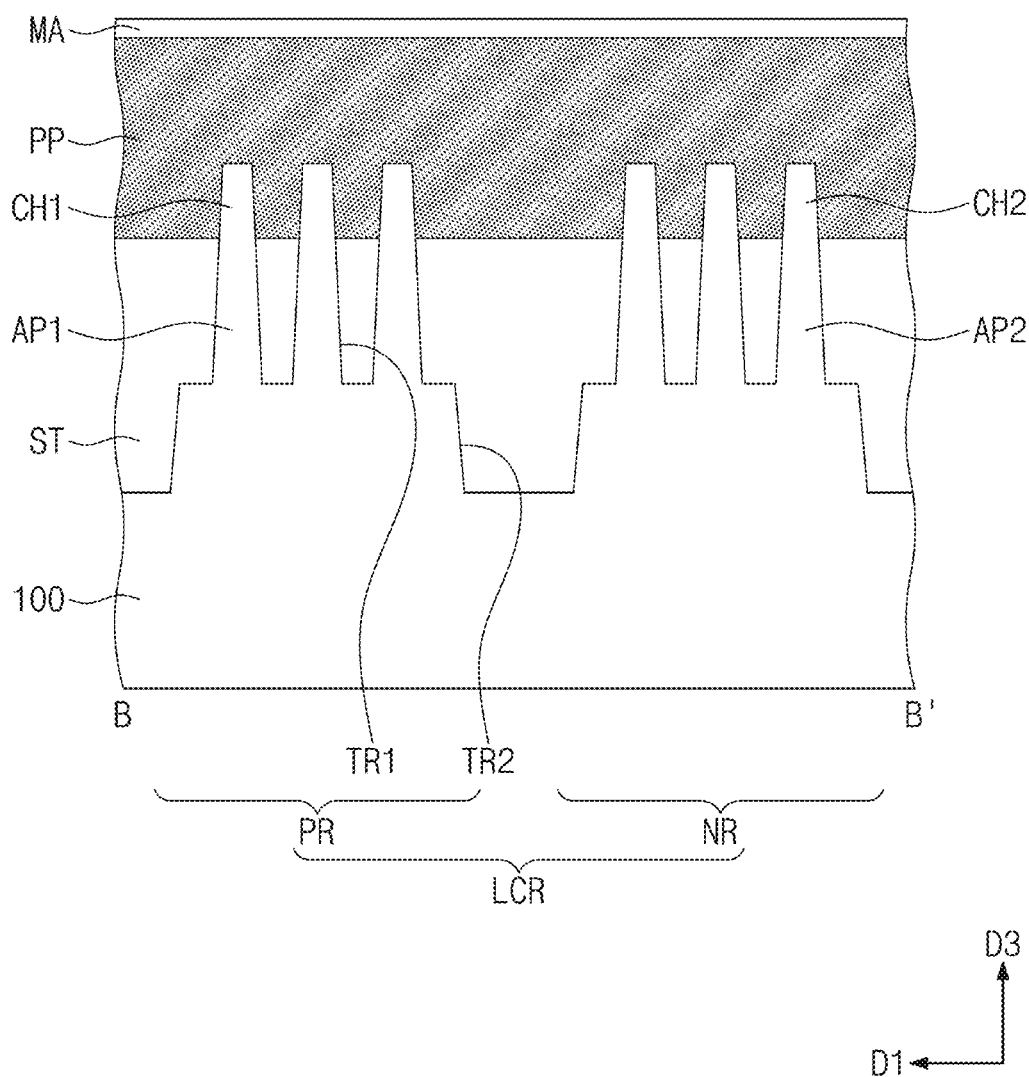
Figure 10C:
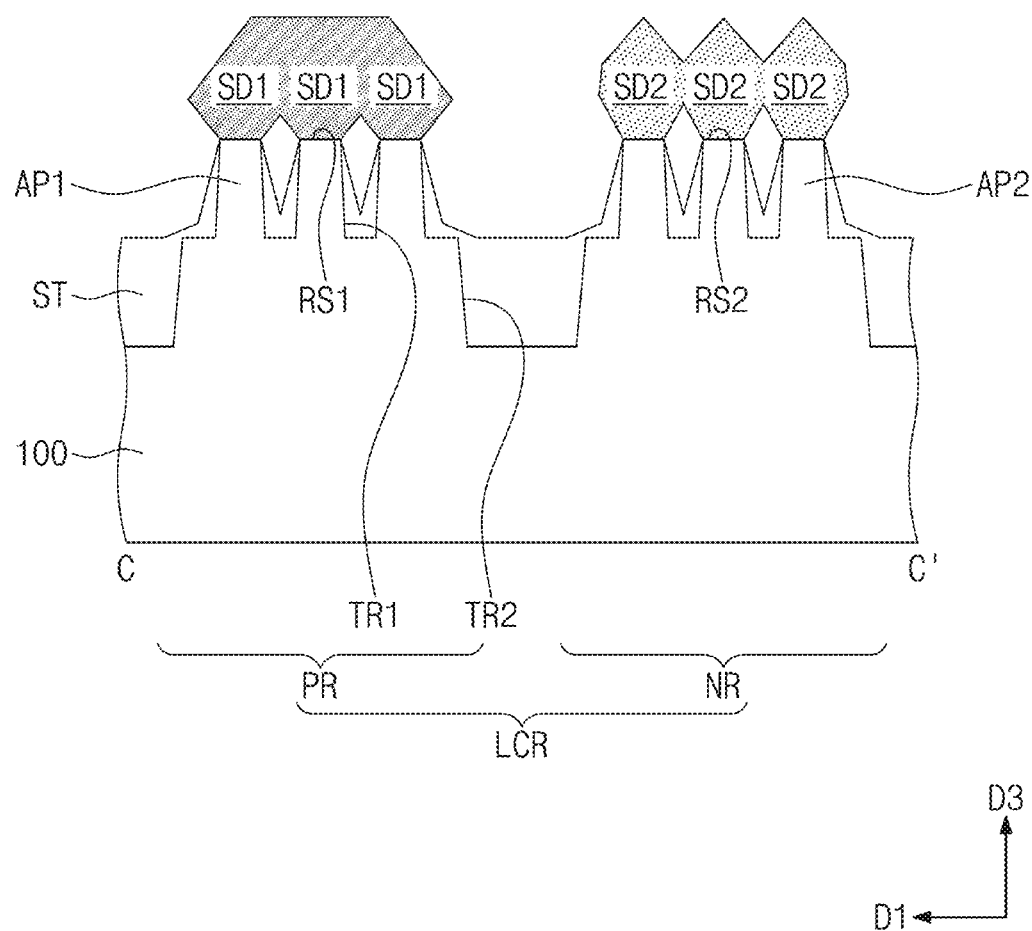
Figure 10D:
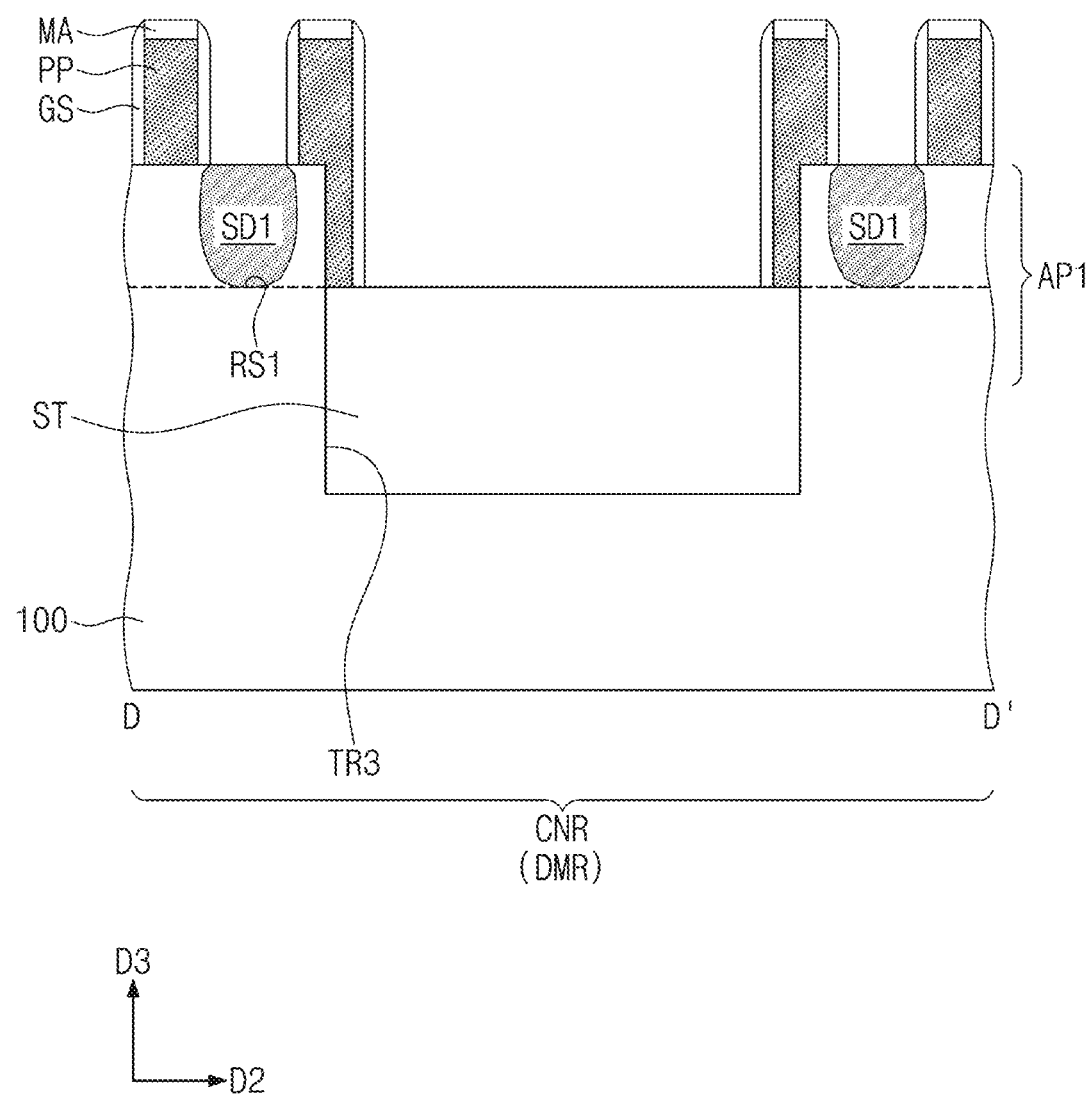
FIGS. 10D and 12D are sectional views taken along lines D-D' of FIGS. 9 and 11, respectively.
Figure 11:
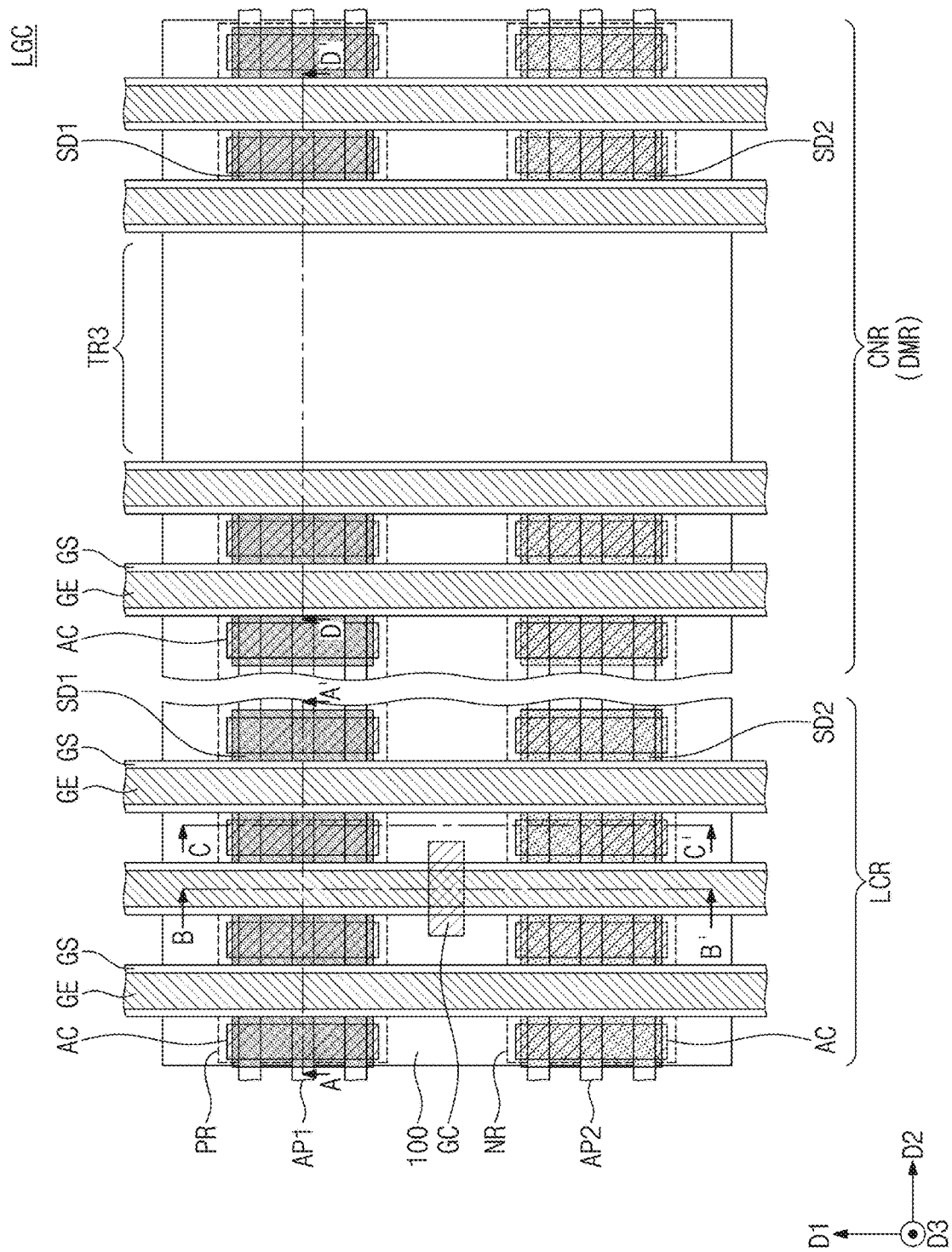

In detail, second recess regions RSR2 may be formed by etching an upper portion of the second active pattern AP2 using the hard mask patterns MA and the gate spacers GS as an etch mask (e.g., see FIG. 10C). The second source/drain pattern SD2 may be formed by a selective epitaxial growth process, in which an inner surface of the second recess region RSR2 of the second active pattern AP2 is used as a seed layer. As a result of the formation of the second source/drain patterns SD2, the second channel pattern CH2 may be defined between each pair of the second source/drain patterns SD2. As an example, the second source/drain patterns SD2 may include the semiconductor element (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time. The first and second source/drain patterns SD1 and SD2 may be formed on not only the connection region CNR but also the logic cell region LCR in the same manner.

Referring to FIGS. 11 and 12A to 12D, the first interlayer insulating layer 110 may be formed to cover the first and second source/drain patterns SD1 and SD2, the hard mask patterns MA, and the gate spacers GS. In some example embodiments, the first interlayer insulating layer 110 may be formed of or include silicon oxide.

The first interlayer insulating layer 110 may be planarized to expose the top surfaces of the sacrificial patterns PP. The planarization of the first interlayered insulating layer 110 may be performed using an etch-back or chemical mechanical polishing (CMP) process. In some example embodiments, the hard mask patterns MA may be fully removed during the planarization process. Accordingly, the first interlayer insulating layer 110 may have a top surface that is coplanar or substantially coplanar with the top surfaces of the sacrificial patterns PP and the top surfaces of the gate spacers GS.

The sacrificial patterns PP may be replaced with the gate electrodes GE, respectively. In detail, the sacrificial patterns PP exposed may be selectively removed. Empty spaces may be formed as a result of the removal of the sacrificial patterns PP. The gate insulating layer GI, the gate electrode GE, and the gate capping pattern GP may be formed in each of the empty spaces. The gate electrode GE may include a first metal pattern and a second metal pattern on the first metal pattern. The first metal pattern may be formed of a work function metal, which is used to adjust a threshold voltage of a transistor, and the second metal pattern may be formed of a metallic material having a low resistance.

The second interlayer insulating layer 120 may be formed on the first interlayer insulating layer 110. The second interlayer insulating layer 120 may include a silicon oxide layer. The active contacts AC may be formed to penetrate the second and first interlayer insulating layers 120 and 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

Referring back to FIGS. 2 and 3A to 3E, the third interlayer insulating layer 130 may be formed on the second interlayer insulating layer 120. The connection patterns CNP may be formed in the third interlayer insulating layer 130. The connection patterns CNP may be formed on the active contacts AC and the gate contact GC, respectively.

The fourth interlayer insulating layer 140 may be formed on the third interlayer insulating layer 130. The first metal layer M1 may be formed in the fourth interlayer insulating layer 140. The formation of the first metal layer M1 may include forming the vias VI using a damascene process and forming the interconnection lines INL on the vias VI using a damascene process.

At least one penetration contact TCT may be formed on the connection region CNR, before the formation of the fourth interlayer insulating layer 140 and the first metal layer M1. A process of forming the active contacts AC, the gate contacts GC, and the connection patterns CNP thereon may be a middle-of-line (MOL) process. A process of forming the first metal layer M1 and additional metal layers thereon may be a back-end-of-line (BEOL) process. The penetration contact TCT may be formed between the MOL process and the BEOL process.

FIGS. 13 to 22 are sectional views illustrating a method of forming a penetration contact according to some example embodiments of the inventive concepts. Hereinafter, the method of forming the penetration contact TCT will be described in more detail with reference to FIGS. 13 to 22.

Figure 13:
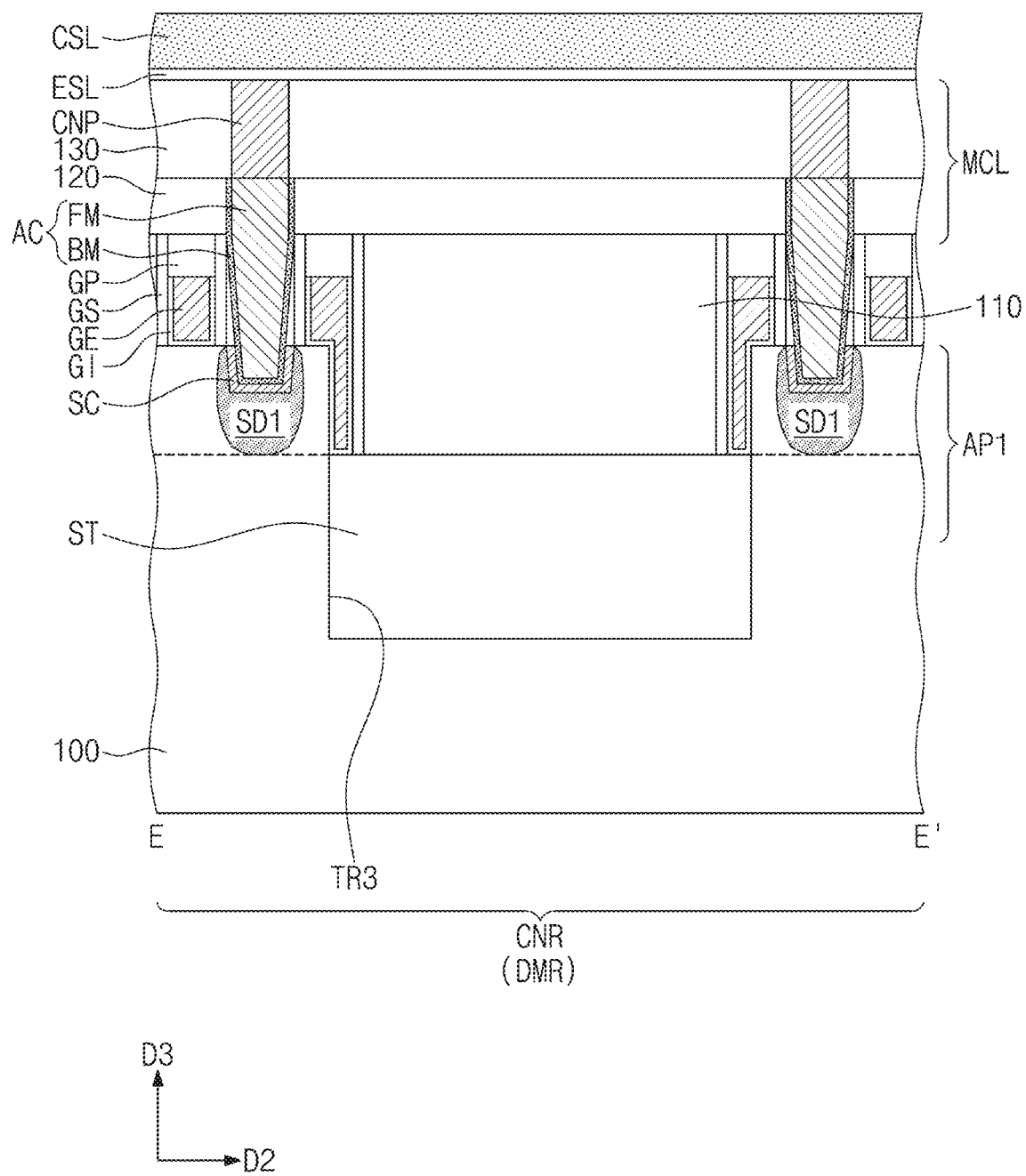
FIGS. 13 to 22 are sectional views illustrating a method of forming a penetration contact according to some example embodiments of the inventive concepts.

Referring to FIG. 13, the etch stop layer ESL and a planarization stop layer CSL may be sequentially formed on the third interlayer insulating layer 130, after the MOL process (e.g., after the formation of the intermediate connection layer MCL). The planarization stop layer CSL may be used as a stop layer in a planarization process, which will be described below, and may be formed of or include at least one of SiN, SiCN, or SiON. The etch stop layer ESL may be formed of or include a material having an etch selectivity with respect to the planarization stop layer CSL. For example, the etch stop layer ESL may include a silicon nitride layer and/or a silicon oxide layer.

Figure 14:
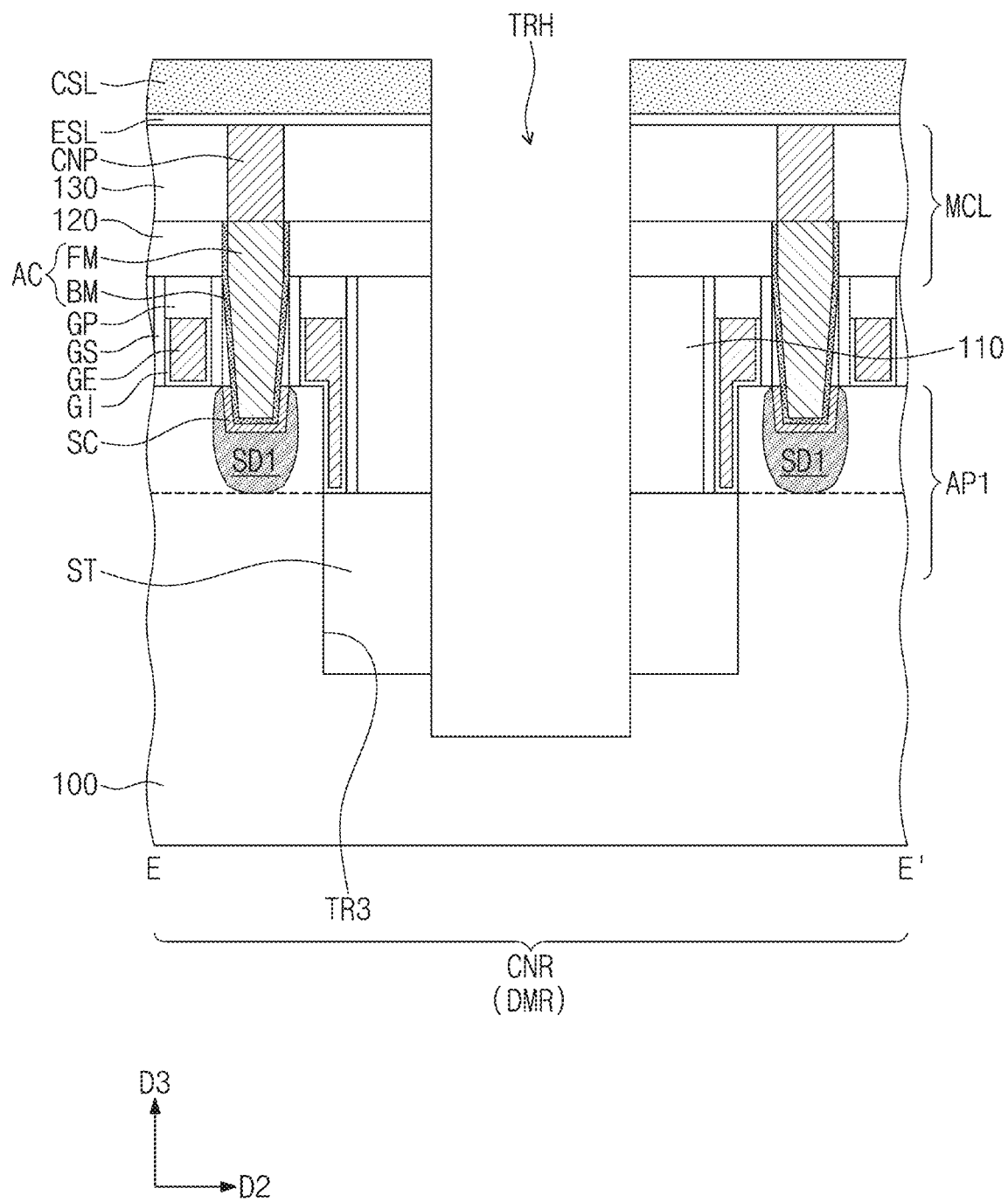

Referring to FIG. 14, a penetration hole TRH may be formed on the connection region CNR to penetrate the device isolation layer ST. In detail, an anisotropic etching process may be performed on the planarization stop layer CSL to form the penetration hole TRH penetrating the first to third interlayer insulating layers 110, 120, and 130 and the device isolation layer ST. The penetration hole TRH may be extended toward the bottom surface of the substrate 100 to penetrate an upper portion of the substrate 100. The penetration hole TRH may not penetrate the entirety of the substrate 100.

Figure 15:
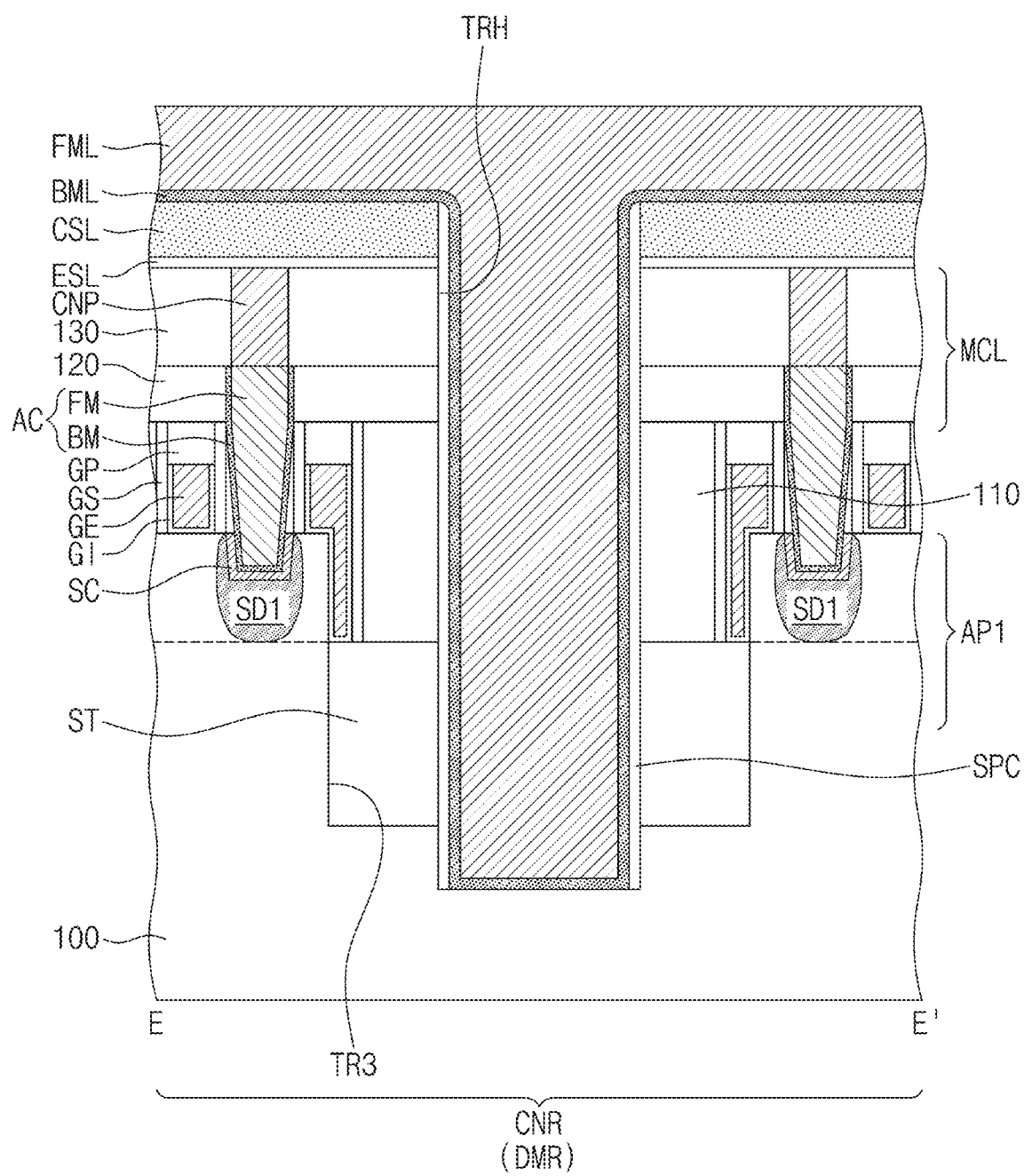

Referring to FIG. 15, the insulating spacer SPC may be formed on an inner side surface of the penetration hole TRH. In some example embodiments, the formation of the insulating spacer SPC may include conformally forming an insulating layer in the penetration hole TRH and anisotropically etching the insulating layer.

A barrier layer BML and a conductive layer FML may be sequentially formed to fill the penetration hole TRH. The barrier layer BML may be conformally formed in the penetration hole TRH. The barrier layer BML may include a metal nitride layer or may include a metal layer and a metal nitride layer. The conductive layer FML may be formed to completely fill a remaining space of the penetration hole TRH provided with the barrier layer BML. The conductive layer FML may be formed of or include a low resistance metal (e.g., copper).

Figure 16:
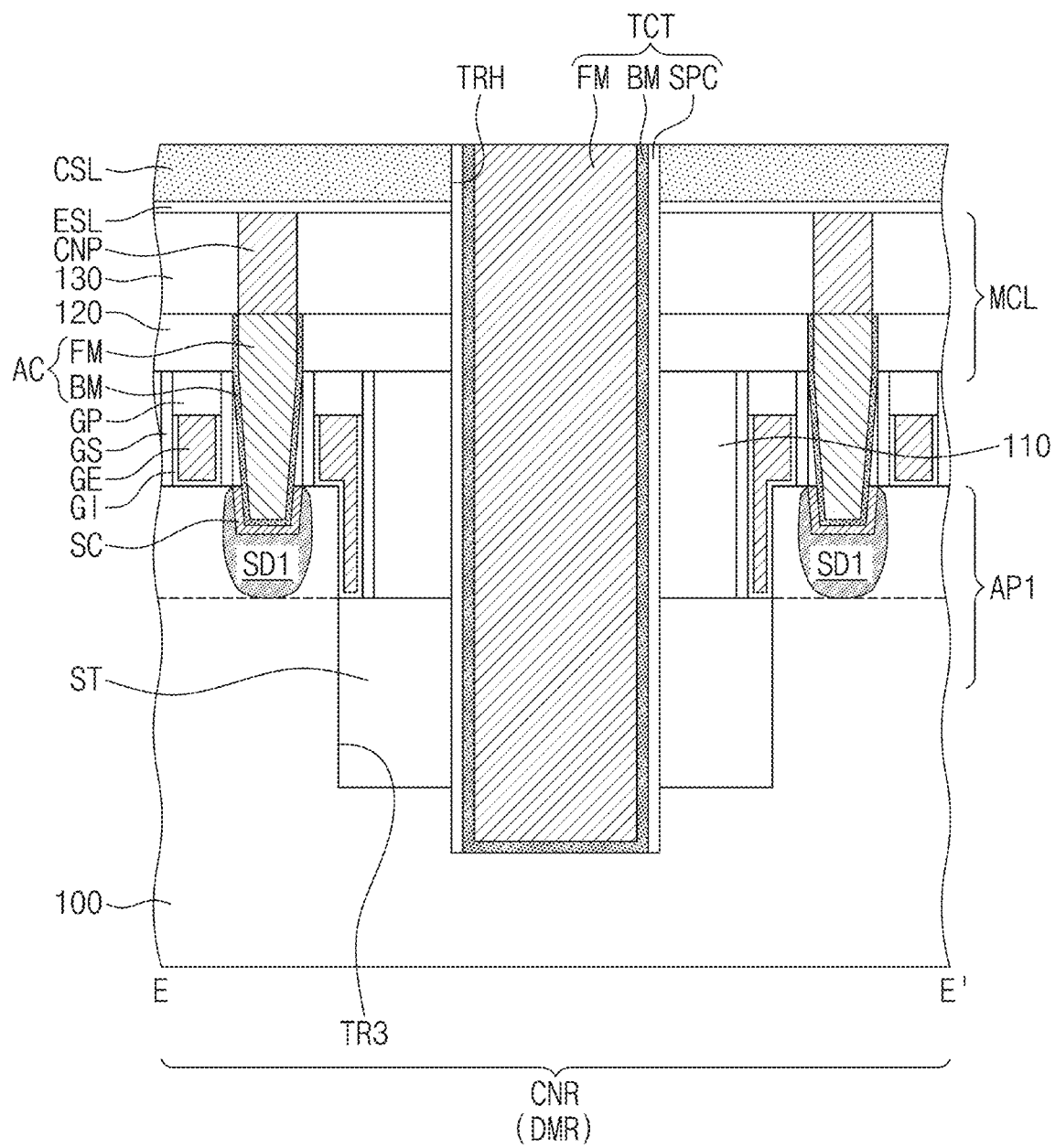

Referring to FIG. 16, a first planarization process may be performed on the conductive layer FML to form the penetration contact TCT. The first planarization process may be performed to expose the planarization stop layer CSL. The barrier layer BML and the conductive layer FML on the planarization stop layer CSL may be completely removed during the first planarization process.

The insulating spacer SPC, the barrier pattern BM, and the conductive pattern FM may be left in the penetration hole TRH. They may constitute the penetration contact TCT. As a result of the first planarization process, the insulating spacer SPC, the barrier pattern BM, the conductive pattern FM, and the planarization stop layer CSL may have top surfaces that are coplanar or substantially coplanar with each other.

Figure 17:
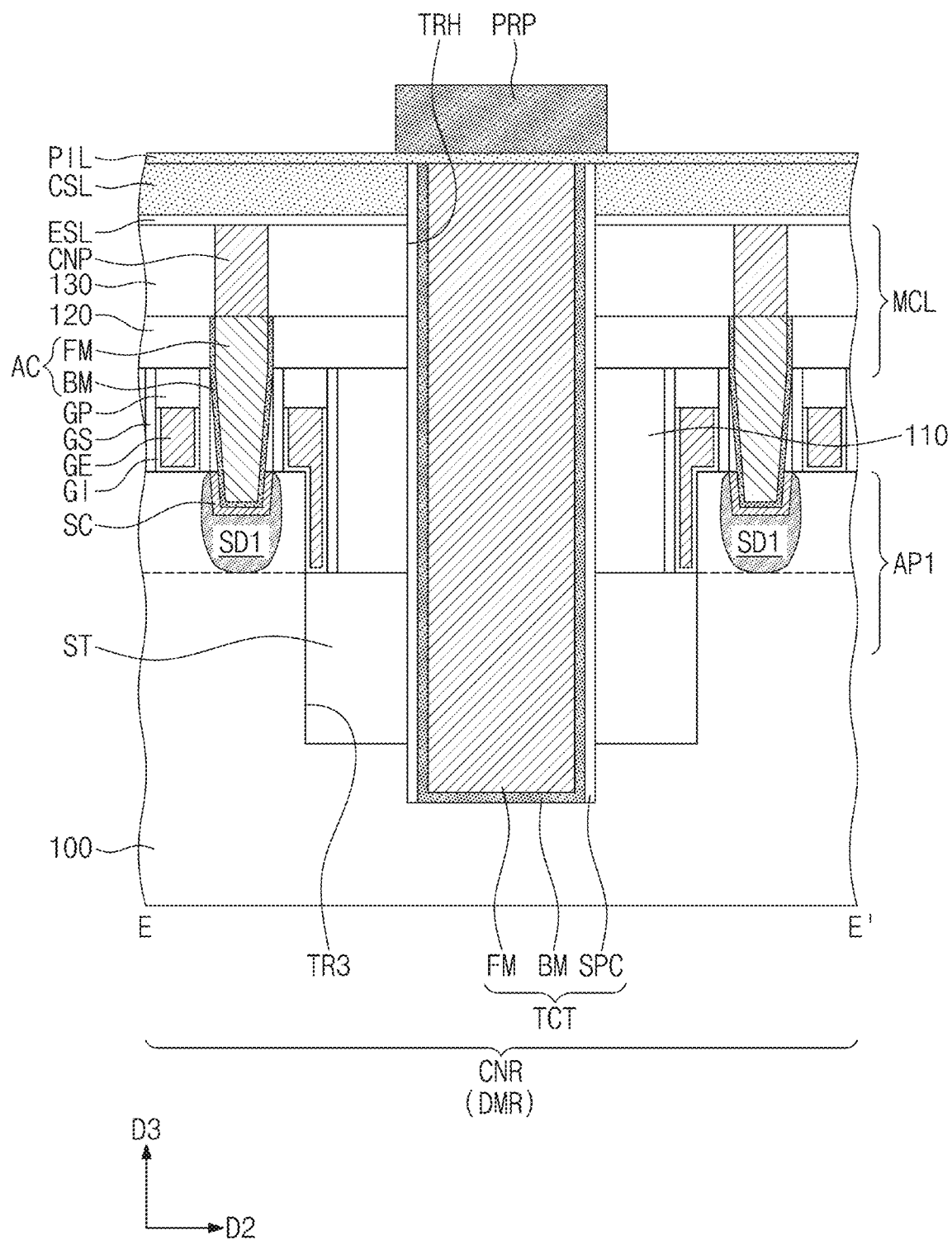

Referring to FIG. 17, a protection insulating layer PIL may be formed on the planarization stop layer CSL and the penetration contact TCT. The protection insulating layer PIL may be formed of or include at least one of SiN, SiCN, or SiON. In some example embodiments, the protection insulating layer PIL may be formed of or include the same material as the planarization stop layer CSL.

A photoresist pattern PRP may be formed to be vertically overlapped with the penetration contact TCT. The photoresist pattern PRP may be provided to selectively cover a region of the protection insulating layer PIL on the penetration contact TCT and to expose other regions of the protection insulating layer PIL.

Figure 18:
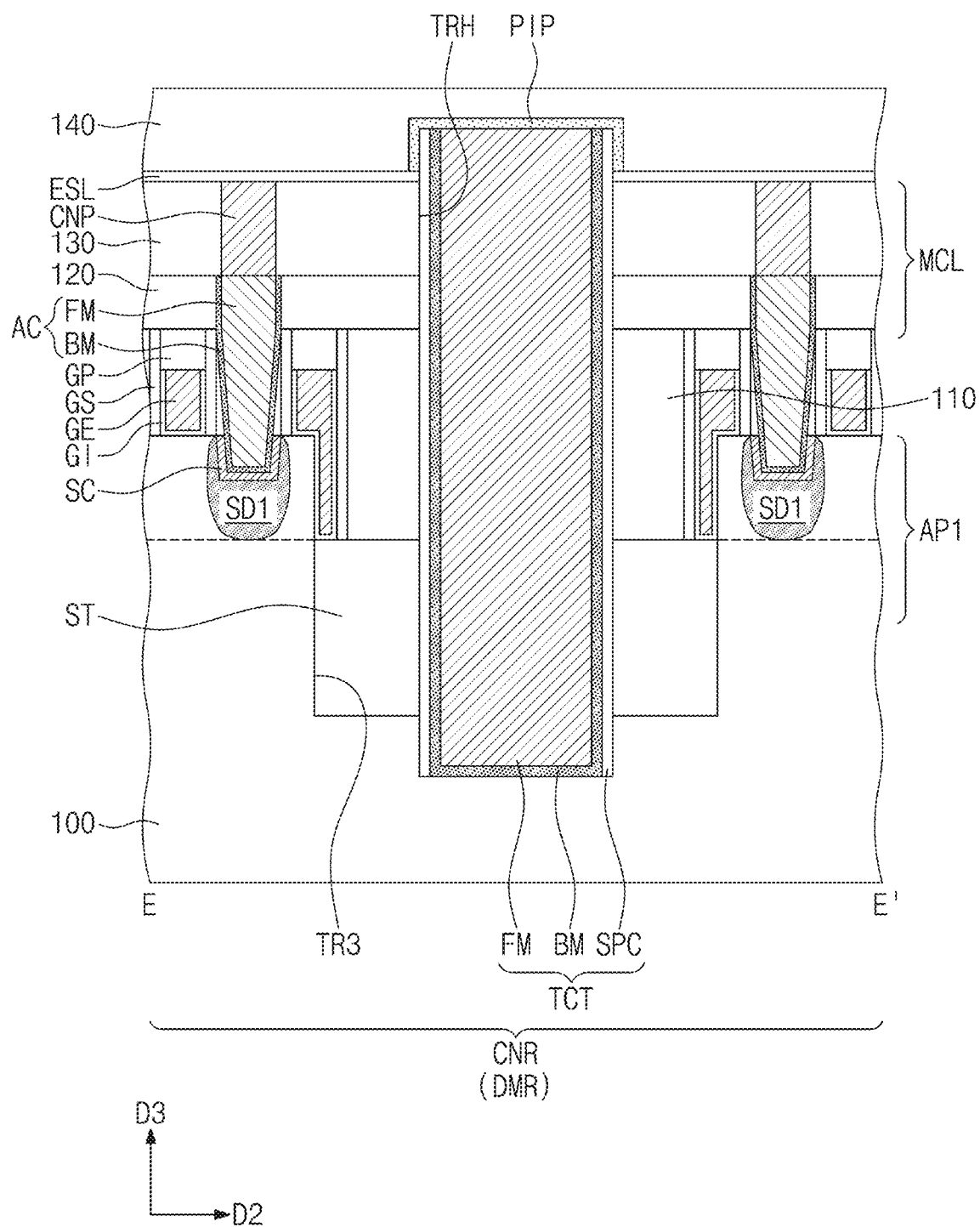

Referring to FIG. 18, the protection insulating layer PIL and the planarization stop layer CSL may be etched using the photoresist pattern PRP as an etch mask. The etching process may be performed to expose the etch stop layer ESL. A portion of the protection insulating layer PIL and a portion of the planarization stop layer CSL, which are placed below the photoresist pattern PRP, may not be etched during the etching process. The portions of the protection insulating layer PIL and the planarization stop layer CSL, which are left after the etching process, may constitute the protection insulating pattern PIP. The protection insulating pattern PIP may cover a top surface of the penetration contact TCT and an upper side surface of the penetration contact TCT. The protection insulating pattern PIP may passivate an exposed portion of the penetration contact TCT. Thereafter, the fourth interlayer insulating layer 140 may be formed on the etch stop layer ESL and the protection insulating pattern PIP.

Figure 19:
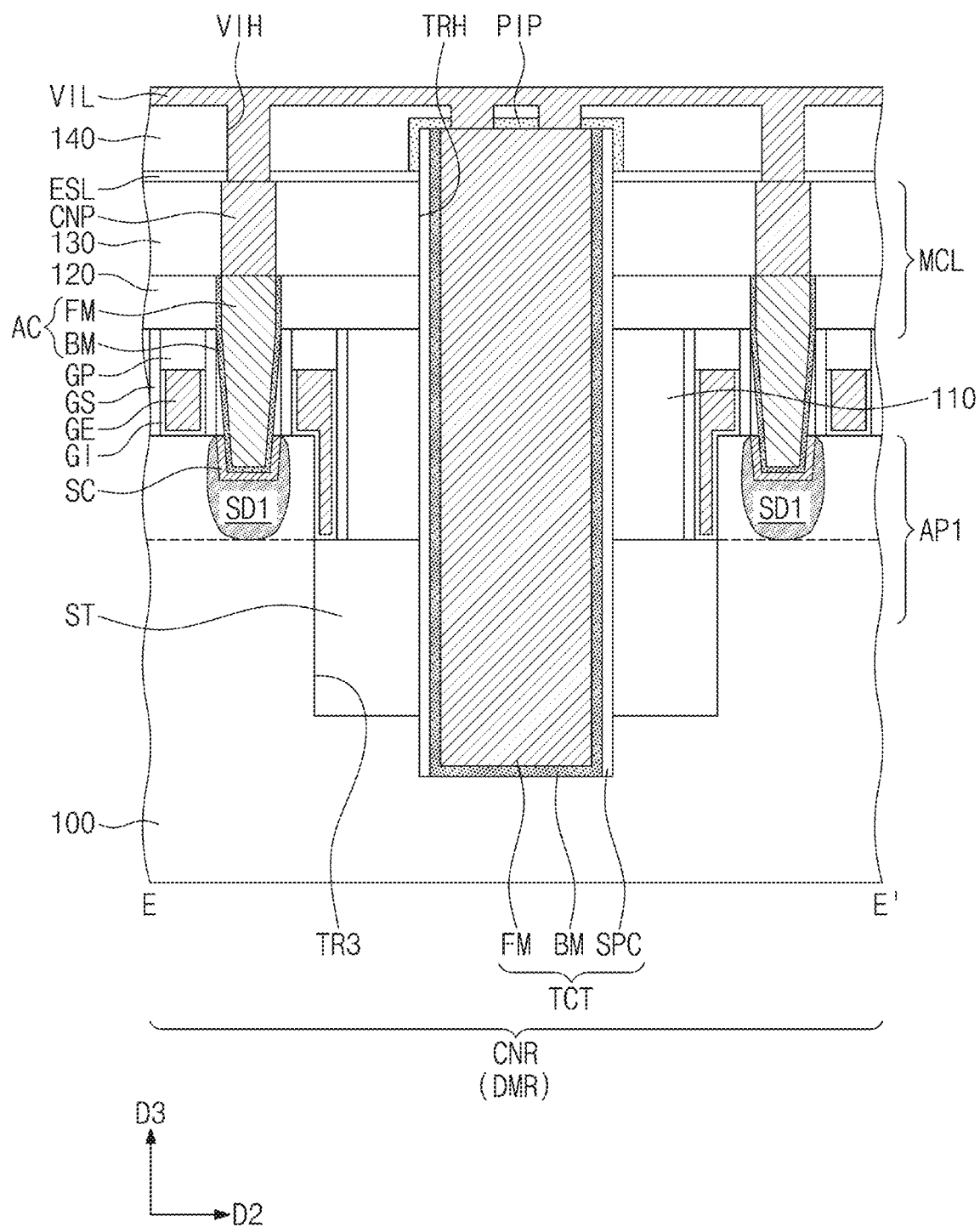

Referring to FIG. 19, a patterning process may be performed on the fourth interlayer insulating layer 140 to form via holes VIH penetrating the fourth interlayer insulating layer 140. Some of the via holes VIH may be formed to expose the top surface of the connection pattern CNP. Others of the via holes VIH may be formed to expose the top surface of the penetration contact TCT. A via conductive layer VIL may be formed on the fourth interlayer insulating layer 140 to fill the via holes VIH.

Figure 20:
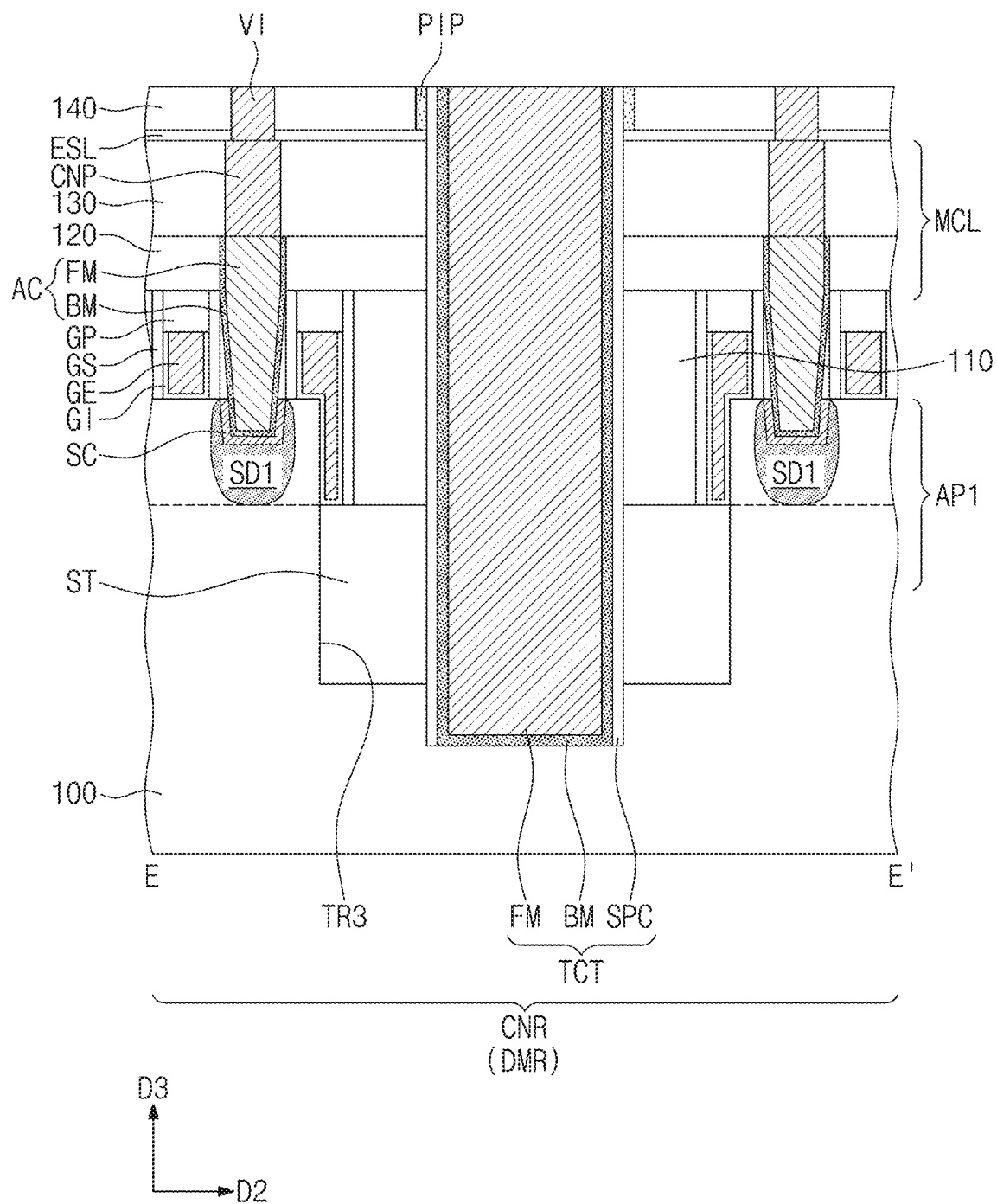

Referring to FIG. 20, a second planarization process may be performed on the via conductive layer VIL to form the vias VI. The second planarization process may be performed to expose the top surface of the penetration contact TCT. The top surface of the penetration contact TCT may be recessed by the second planarization process, as previously described with reference to FIG. 4.

As a result of the second planarization process, the via VI may be absent on the penetration contact TCT. As a result of the second planarization process, the protection insulating pattern PIP may be formed to cover the upper side surface of the penetration contact TCT but not to cover the top surface of the penetration contact TCT.

Figure 21:
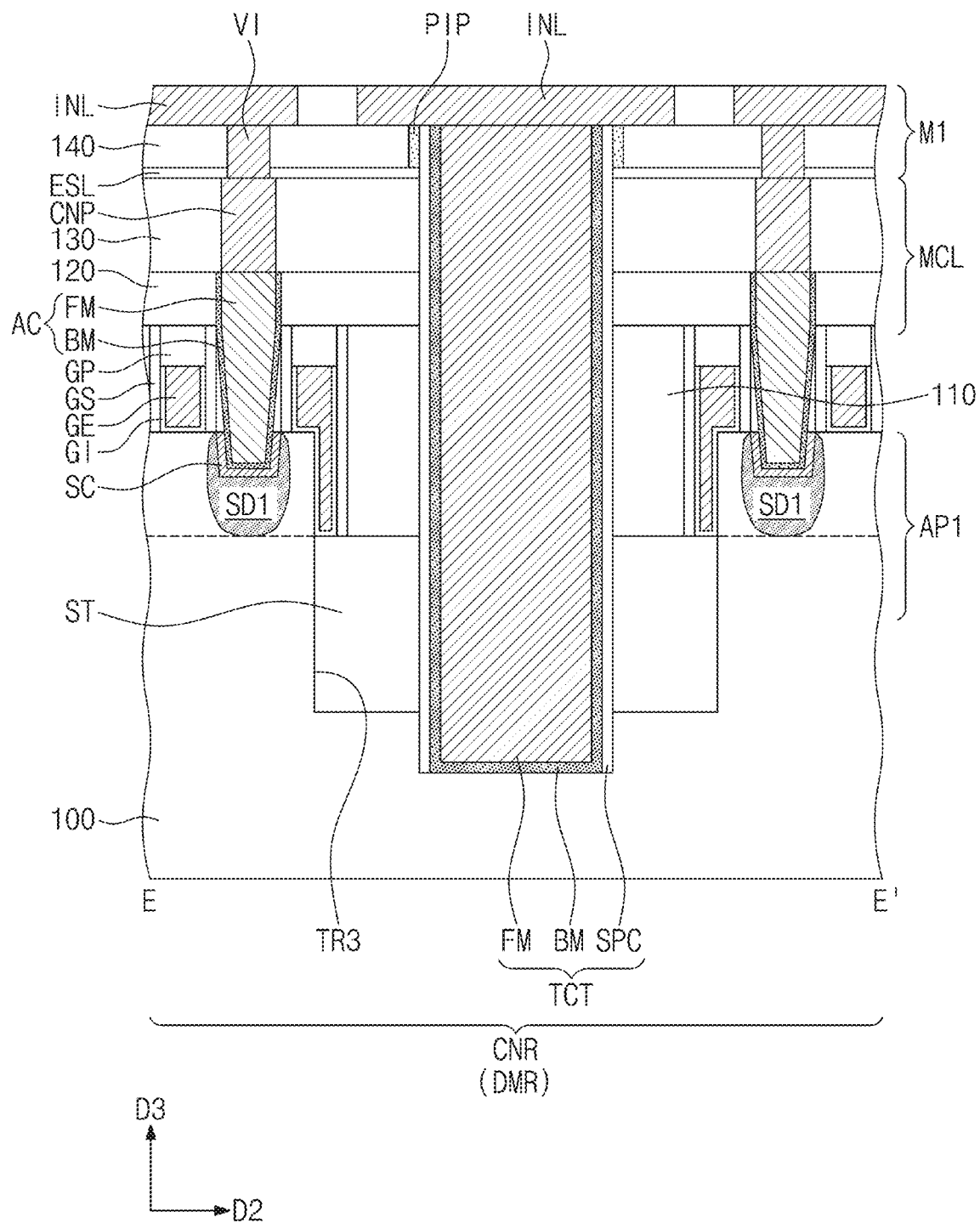

Referring to FIG. 21, a BEOL process may be performed to form the interconnection lines INL on the vias VI, respectively. At least one of the interconnection lines INL may be directly formed on the top surface of the penetration contact TCT. In other words, at least one of the interconnection lines INL may be formed to be in direct contact with the top surface of the penetration contact TCT. The vias VI and the interconnection lines INL may constitute the first metal layer M1.

Thereafter, an additional BEOL process may be performed to form additional metal layers (e.g., a second metal layer, a third metal layer, a fourth metal layer, and so forth) on the first metal layer M1.

Figure 22:
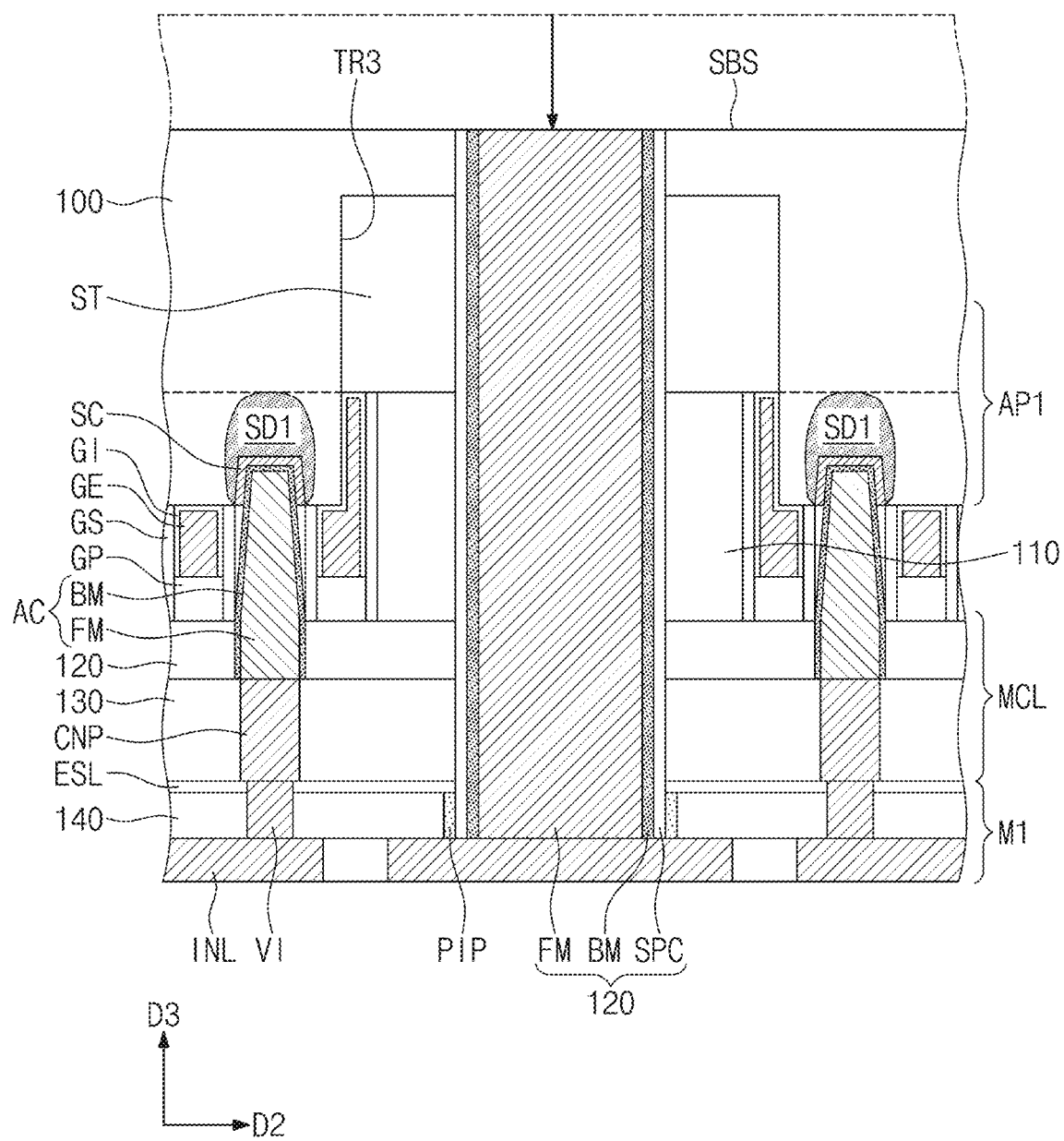

Referring to FIG. 22, the substrate 100 may be inverted after the BEOL process, and then, a third planarization process may be performed on a bottom surface SBS of the substrate 100. The substrate 100 may be thinned by the third planarization process. The third planarization process may be performed to expose the penetration contact TCT. As a result of the third planarization process, the conductive pattern FM of the penetration contact TCT may be exposed through the bottom surface SBS of the substrate 100. Next, a passivation process may be performed on the penetration contact TCT exposed through the bottom surface SBS of the substrate 100 to form the passivation layer PAV, as shown in FIG. 3E.

In the method of forming the penetration contact TCT according to some example embodiments of the inventive concepts, the etch stop layer ESL and the planarization stop layer CSL may be used to stably form the penetration contact TCT without a process defect or with a reduced process defect. Especially, the etch stop layer ESL may protect the connection patterns CNP thereunder during the formation of the penetration contact TCT. Furthermore, a left portion of the planarization stop layer CSL may be exploited as the protection insulating pattern PIP protecting an upper portion of the penetration contact TCT.

In the method of forming the penetration contact TCT according to some example embodiments of the inventive concepts, the penetration contact TCT and the interconnection line INL may be directly connected to each other without the via VI through the second planarization process described above. An electrical resistance between the penetration contact TCT and the interconnection line INL may be reduced, compared with the case in which the via VI is formed between the penetration contact TCT and the interconnection line INL. Furthermore, a process margin may be increased, and thus, the reliability of the semiconductor device may be improved.

Figure 23:
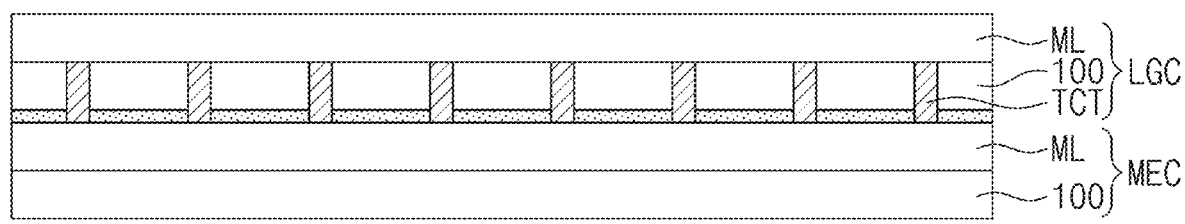
FIG. 23 is a sectional view illustrating a stack of semiconductor chips according to some example embodiments of the inventive concepts.

FIG. 23 is a sectional view illustrating a stack of semiconductor chips according to some example embodiments of the inventive concepts. In the following description, an element previously described with reference to FIGS. 1, 2, and 3A to 3E may be identified by the same reference number without repeating an overlapping description thereof.

Referring to FIG. 23, a memory chip MEC may be provided, and the logic chip LGC may be stacked on the memory chip MEC. The logic chip LGC of FIG. 18 may be the logic chip LGC previously described with reference to FIGS. 1, 2, and 3A to 3E. The logic chip LGC may include the substrate 100, on which an integrated circuit is formed, and a metal layer ML, which is provided on the substrate 100. The metal layer ML may be provided to have a plurality of metal layers and may include the first metal layer M1 described above. The logic chip LGC may include at least one penetration contact TCT, which is downwardly extended from the metal layer ML to penetrate the substrate 100.

Similar to the logic chip LGC, the memory chip MEC may include the substrate 100, on which memory cells are formed, and the metal layer ML provided on the substrate 100. In some example embodiments, the memory chip MEC may be a DRAM chip or an SRAM chip. The metal layer ML of the memory chip MEC may be electrically connected to the penetration contact TCT.

A connection layer CNL may be provided between the memory chip MEC and the logic chip LGC. The connection layer CNL may be provided to attach the memory chip MEC to the logic chip LGC. Although not shown, at least one connection pad (e.g., micro bumps or copper pads) may be provided in the connection layer CNL to connect the penetration contact TCT of the logic chip LGC to the metal layer ML of the memory chip MEC.

Figure 24:
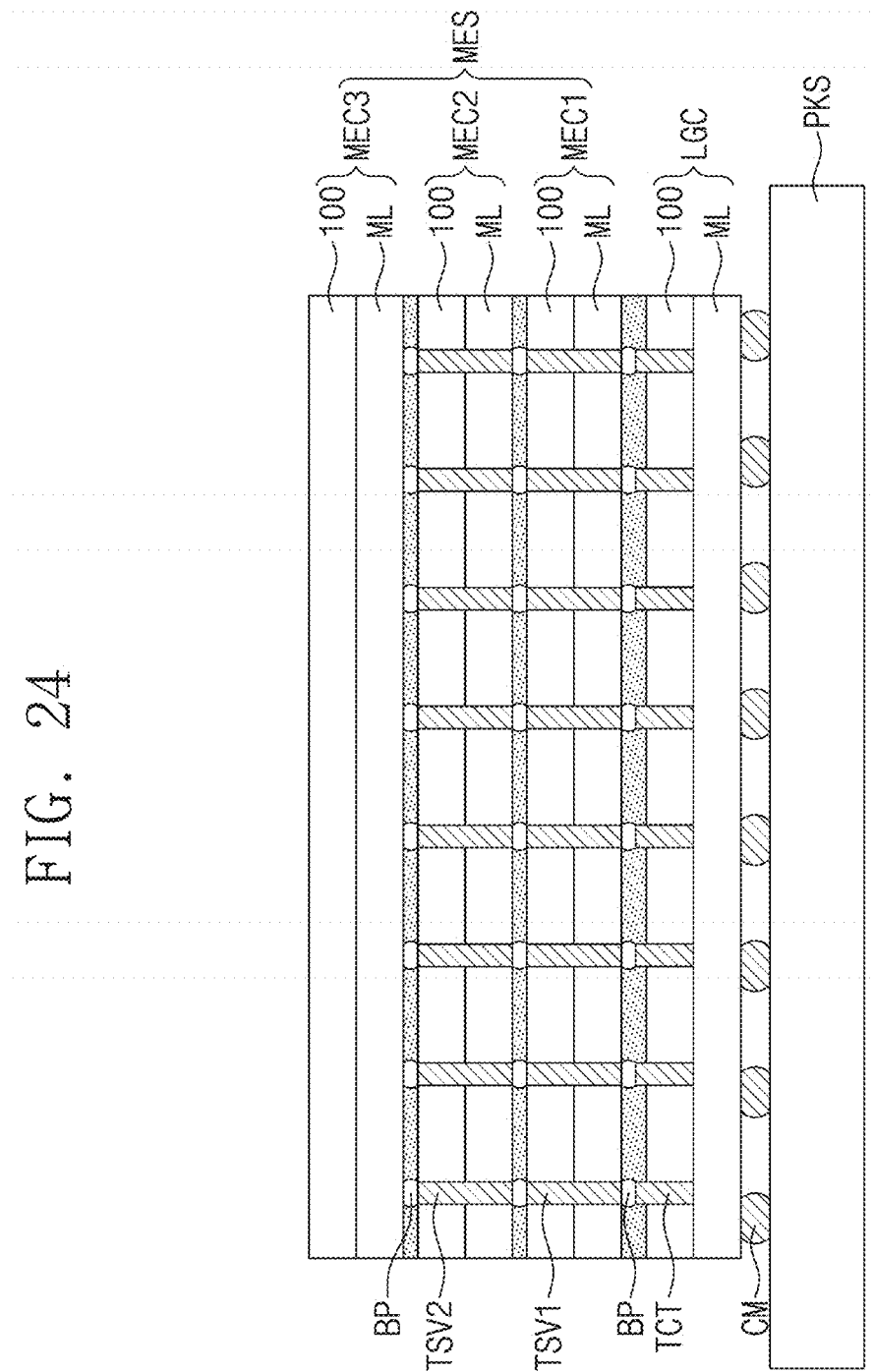
FIG. 24 is a sectional view illustrating a semiconductor package according to some example embodiments of the inventive concepts.
Figure 25A:
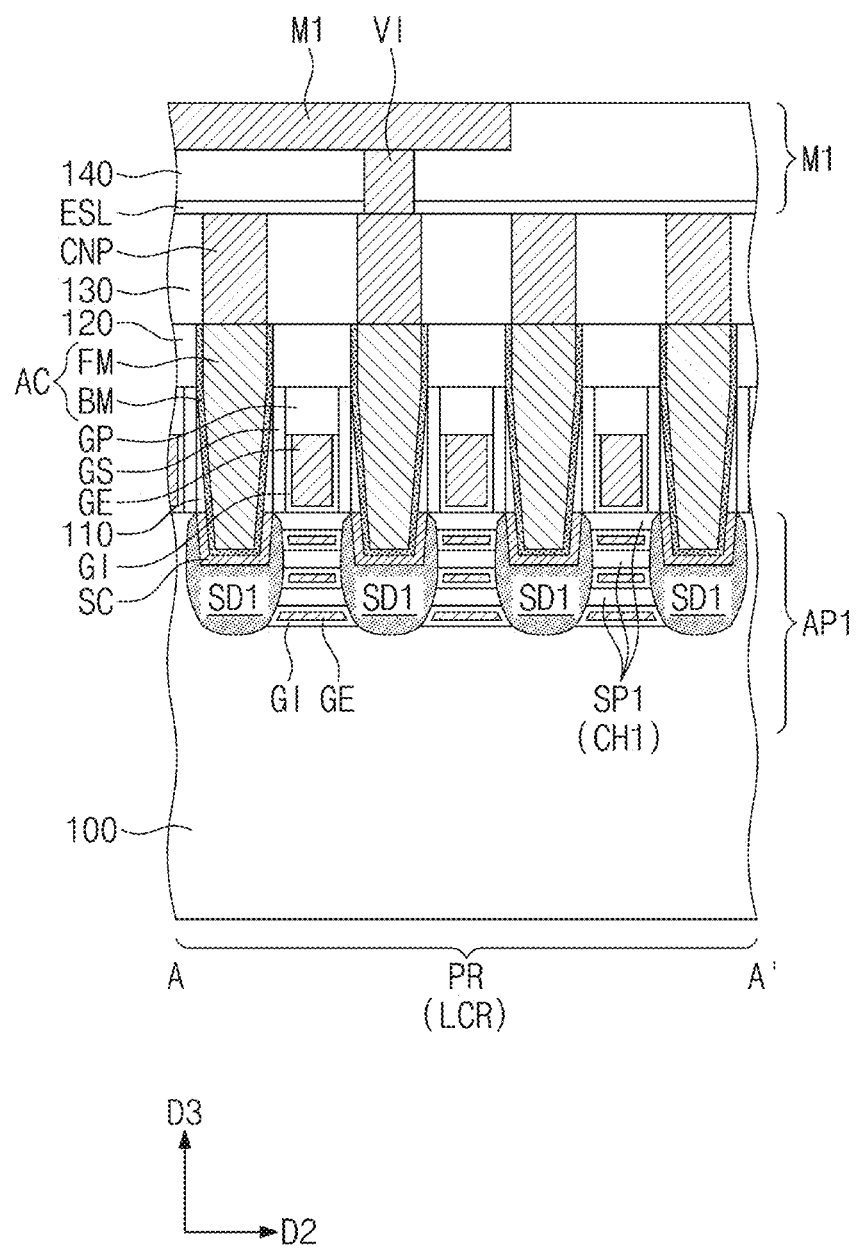
FIGS. 25A to 25E are sectional views, which are respectively taken along the lines A-A', B-B', C-C', D-D', and E-E' of FIG. 2 to illustrate a semiconductor device according to some example embodiments of the inventive concepts.
Figure 25B:
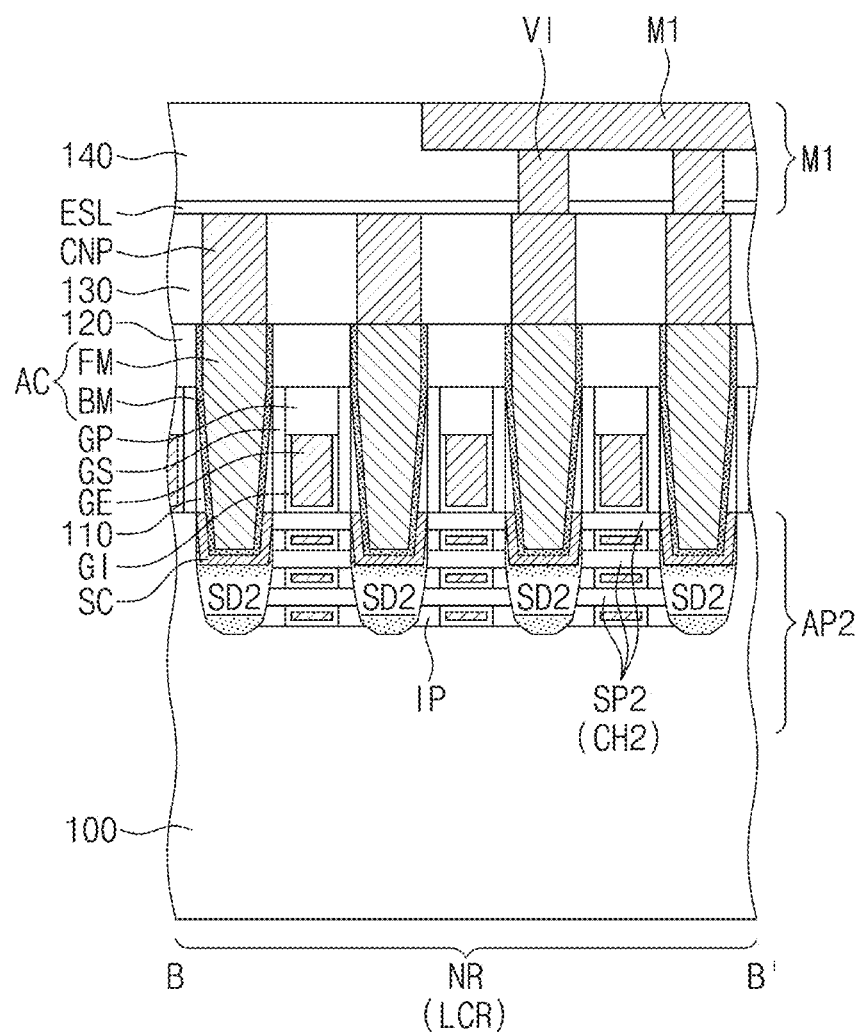
Figure 25C:
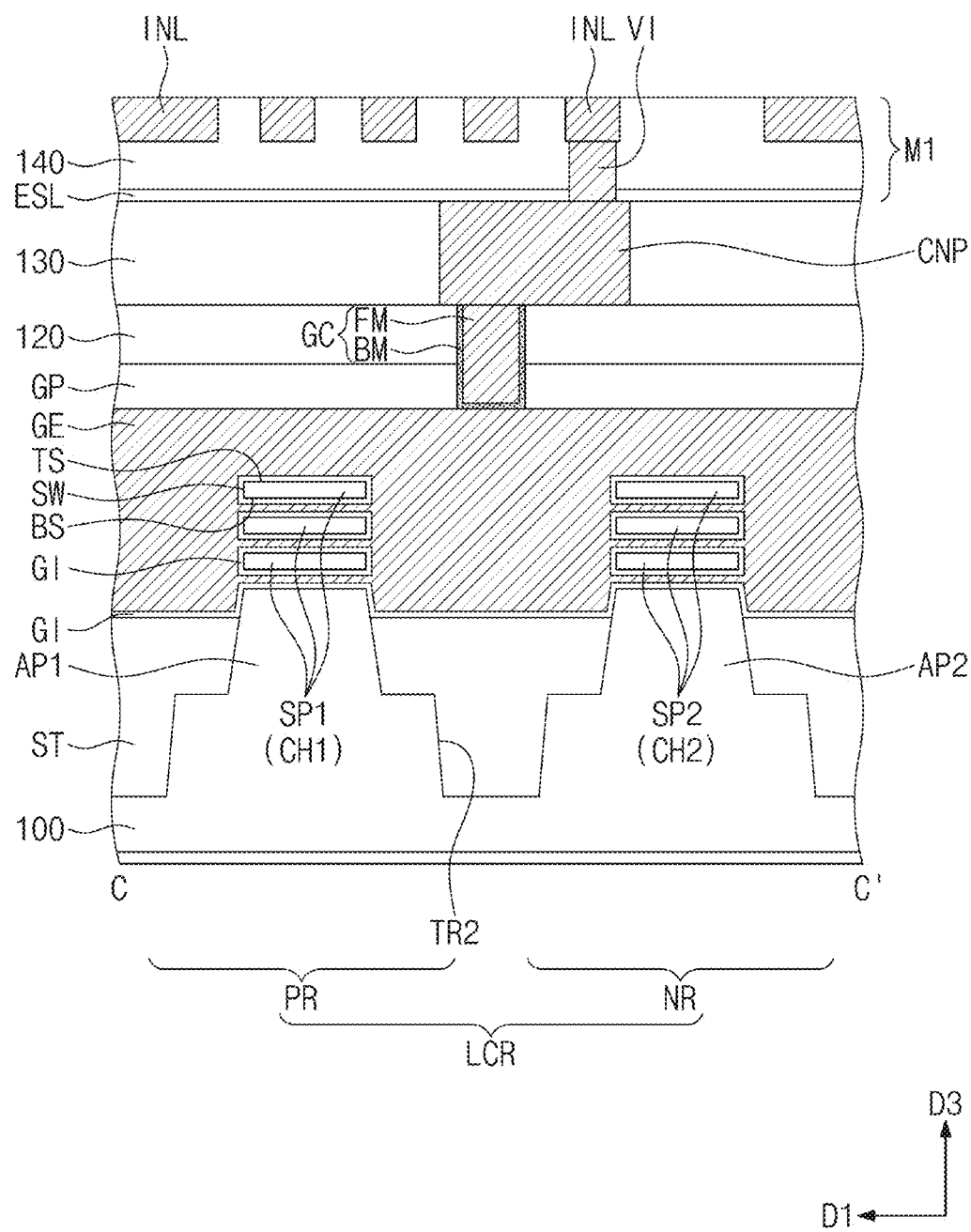
Figure 25D:
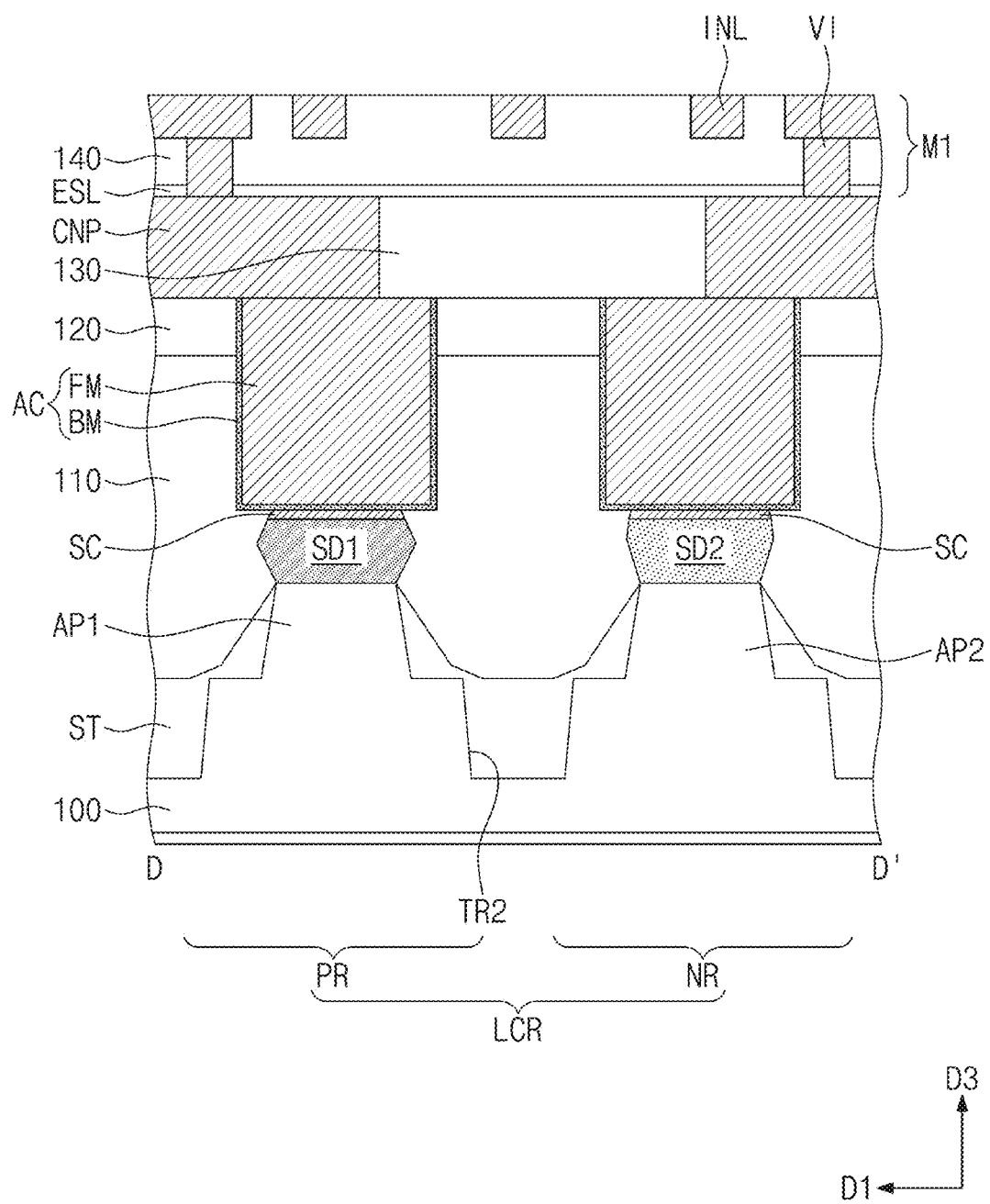
Figure 25E:
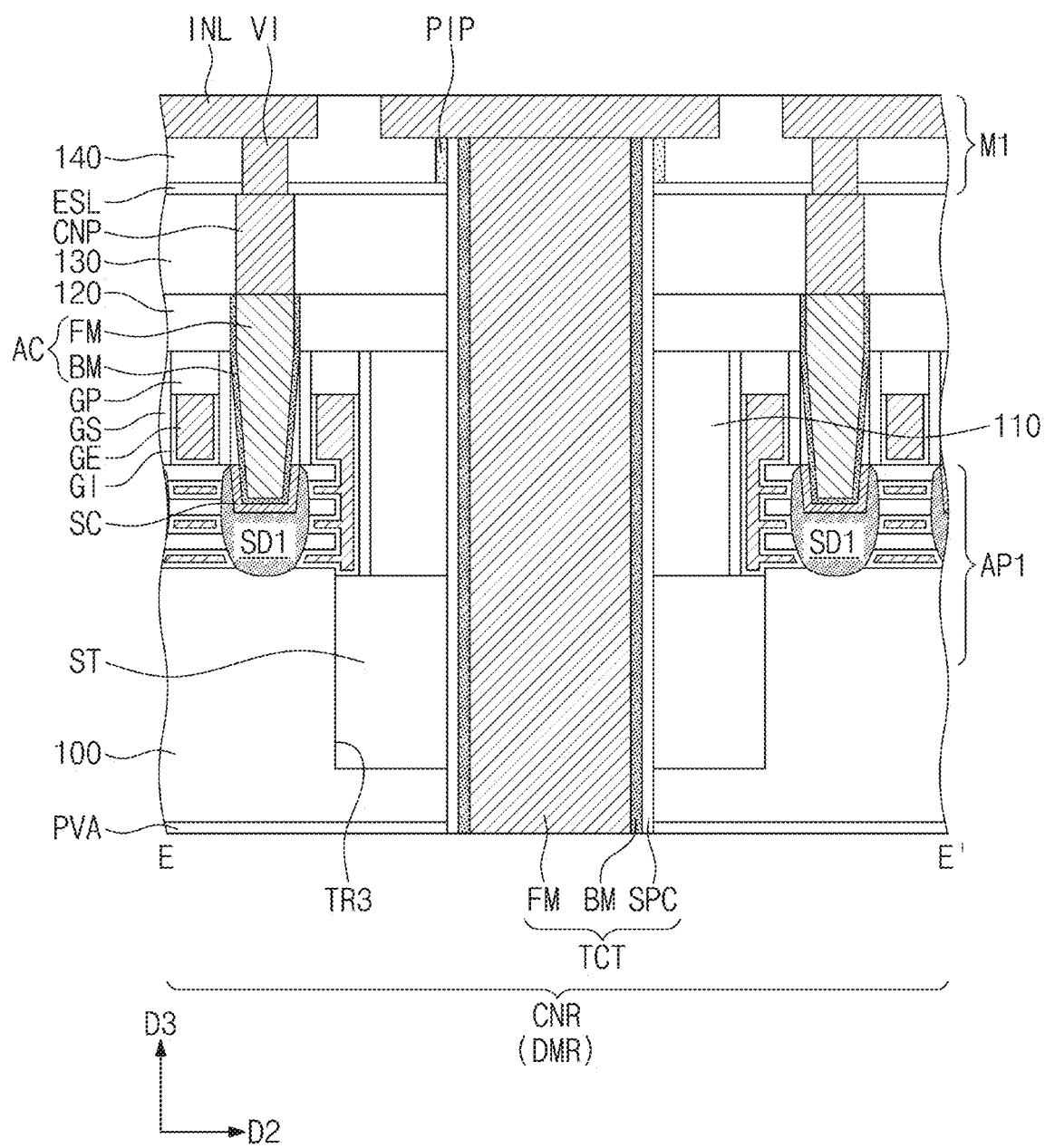

FIG. 24 is a sectional view illustrating a semiconductor package according to some example embodiments of the inventive concepts. In the following description of some example embodiments, an element previously described with reference to FIG. 23 may not be described in much further detail for the sake of brevity.

Referring to FIG. 24, the logic chip LGC may be provided on a package substrate PKS and a memory stack MES may be provided on the logic chip LGC. In some example embodiments, the memory stack MES may include first to third memory chips MEC1, MEC2, and MEC3, which are sequentially stacked.

As previously described with reference to FIG. 23, the logic chip LGC and the first memory chip MEC1 may be connected to each other through at least one of the penetration contacts TCT, which are provided to penetrate the substrate 100 of the logic chip LGC.

At least one first penetration via TSV1 may be provided to penetrate the first memory chip MEC1. At least one second penetration via TSV2 may be provided to penetrate the second memory chip MEC2. The first to third memory chips MEC1, MEC2, and MEC3 may be connected to each other through the first penetration via TSV1 and the second penetration via TSV2. In some example embodiments, such a penetration via may not be provided in the topmost memory chip (e.g., the third memory chip MEC3).

Connection pads BP may be respectively provided between the penetration contact TCT and the first memory chip MEC1, between the first penetration via TSV1 and the second memory chip MEC2, and between the second penetration via TSV2 and the third memory chip MEC3.

Connection members CM may be provided between the package substrate PKS and the metal layer ML of the logic chip LGC to electrically connect them to each other.

In some example embodiments, the memory stack MES may be provided on the logic chip LGC, and they may be vertically connected to each other through the penetration contact TCT, the first penetration via TSV1, and the second penetration via TSV2. Since the logic chip LGC is vertically and directly connected to the memory stack MES, a length of signal paths therebetween may be relatively reduced. In this case, it may be possible to increase an operation speed of the semiconductor package according to some example embodiments.

FIGS. 25A to 25E are sectional views, which are respectively taken along the lines A-A', B-B', C-C', D-D', and E-E' of FIG. 2 to illustrate a semiconductor device according to some example embodiments of the inventive concepts. In the following description, an element previously described with reference to FIGS. 1, 2, and 3A to 3E may be identified by the same reference number without repeating an overlapping description thereof.

Referring to FIGS. 2 and 25A to 25E, the substrate 100 including the logic cell region LCR and the connection region CNR may be provided. Here, the logic cell region LCR may include the first active region PR and the second active region NR.

The device isolation layer ST may be provided on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first and second active patterns AP1 and AP2 may include the first and second channel patterns CH1 and CH2, respectively. In detail, the first channel pattern CH1 may include a plurality of first semiconductor patterns SP1, which are vertically stacked. The stacked first semiconductor patterns SP1 may be spaced apart from each other in the third direction D3. The stacked first semiconductor patterns SP1 may be vertically overlapped with each other. The second channel pattern CH2 may include a plurality of second semiconductor patterns SP2, which are vertically stacked. The stacked second semiconductor patterns SP2 may be spaced apart from each other in the third direction D3. The stacked second semiconductor patterns SP2 may be vertically overlapped with each other. The first and second semiconductor patterns SP1 and SP2 may be formed of or include at least one of silicon (Si), germanium (Ge), or silicon-germanium (SiGe).

The first active pattern AP1 may further include the first source/drain patterns SD1. The stacked first semiconductor patterns SP1 constituting the first channel pattern CH1 may be interposed between an adjacent pair of the first source/drain patterns SD1. The stacked first semiconductor patterns SP1 may connect the adjacent pair of the first source/drain patterns SD1 to each other.

The second active pattern AP2 may further include the second source/drain patterns SD2. The stacked second semiconductor patterns SP2 constituting the second channel pattern CH2 may be interposed between an adjacent pair of the second source/drain patterns SD2. The stacked second semiconductor patterns SP2 may connect the adjacent pair of the second source/drain patterns SD2 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE.

Referring back to FIG. 25C, the gate electrode GE may be provided to surround each of the first and second semiconductor patterns SP1 and SP2. For example, the gate electrode GE may be provided on a top surface TS, at least one side surface SW, and a bottom surface BS of the uppermost one of the first semiconductor patterns SP1. In other words, the gate electrode GE may be provided to face the top surface, the bottom surface, and opposite side surfaces of each of the first and second semiconductor patterns SP1 and SP2. The transistor according to some example embodiments may be a three-dimensional field effect transistor (e.g., MBCFET or GAAFET) in which the gate electrode GE is provided to three-dimensionally surround the channel pattern CH1 or CH2.

Referring back to FIGS. 2 and 25A to 25E, the gate insulating layer GI may be provided between each of the first and second channel patterns CH1 and CH2 and the gate electrode GE. The gate insulating layer GI may be provided to surround each of the first and second semiconductor patterns SP1 and SP2.

On the second active region NR, an insulating pattern IP may be interposed between the gate insulating layer GI and the second source/drain pattern SD2. The gate electrode GE may be spaced apart from the second source/drain pattern SD2 by the gate insulating layer GI and the insulating pattern IP. In some example embodiments, the insulating pattern IP may be omitted on the first active region PR.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contact GC may be provided to penetrate the second interlayer insulating layer 120 and the gate capping pattern GP and to be electrically connected to the gate electrode GE. The active contacts AC and the gate contacts GC may be configured to have substantially the same features as those described with reference to FIGS. 2 and 3A to 3D.

The third interlayer insulating layer 130 may be provided on the second interlayer insulating layer 120. The connection patterns CNP may be provided in the third interlayer insulating layer 130. The fourth interlayer insulating layer 140 may be provided on the third interlayer insulating layer 130. The first metal layer M1 may be provided in the fourth interlayer insulating layer 140.

The penetration contact TCT may be provided on the connection region CNR. The penetration contact TCT may be provided to penetrate the device isolation layer ST filling the third trench TR3 and the substrate 100 thereunder. The penetration contact TCT may be vertically extended from the interconnection line INL of the first metal layer M1 to the bottom surface of the substrate 100. The penetration contact TCT may be configured to have substantially the same features as that described with reference to FIGS. 2, 3E, and 4.

Figure 26:
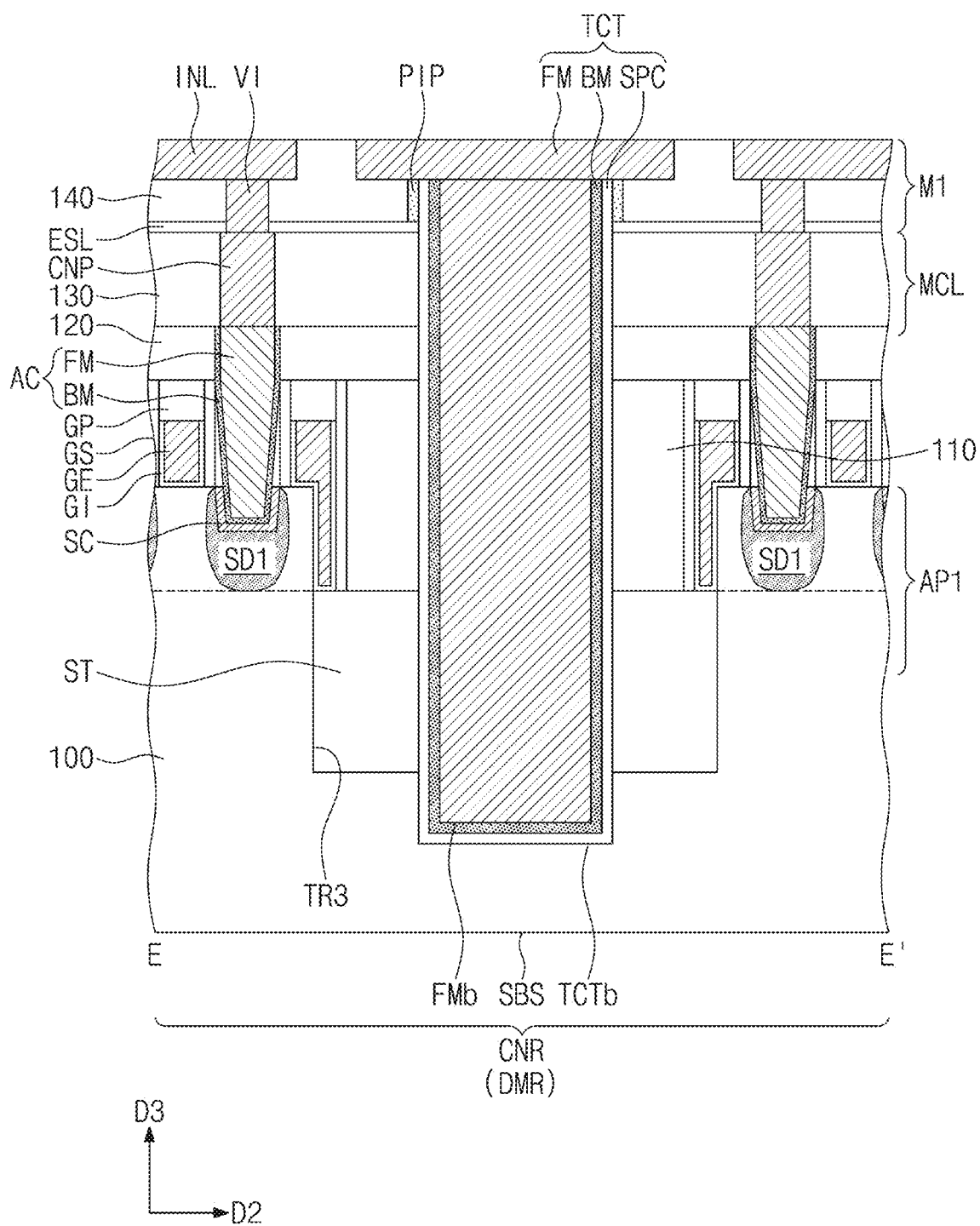
FIG. 26 is a sectional view, which is taken along the line E-E' of FIG. 2 to illustrate a semiconductor device according to some example embodiments of the inventive concepts.

FIG. 26 is a sectional view, which is taken along the line E-E' of FIG. 2 to illustrate a semiconductor device according to some example embodiments of the inventive concepts. In the following description, an element previously described with reference to FIGS. 1, 2, and 3A to 3E may be identified by the same reference number without repeating an overlapping description thereof.

Referring to FIGS. 2 and 26, a bottom surface TCTb of the penetration contact TCT may be located at a level higher than the bottom surface SBS of the substrate 100. In other words, the bottom surface TCTb of the penetration contact TCT may be covered with the substrate 100. The barrier pattern BM and the insulating spacer SPC may be interposed between a bottom surface FMb of the conductive pattern FM of the penetration contact TCT and the substrate 100. The barrier pattern BM may directly cover the bottom surface FMb of the conductive pattern FM. The insulating spacer SPC may be interposed between the substrate 100 and the barrier pattern BM covering the bottom surface FMb of the conductive pattern FM.

According to some example embodiments of the inventive concepts, a semiconductor device may include a penetration contact, which is provided to penetrate a substrate, and here, the penetration contact may be in direct contact with an interconnection line of a first metal layer without any via. Thus, an electrical resistance between the penetration contact and the interconnection line may be reduced to a relatively very low value. In addition, a contact surface between the penetration contact and the interconnection line may be formed to have a curved shape, and in this case, an area of the contact surface may be increased. Thus, the electrical resistance between the penetration contact and the interconnection line may be further reduced. As a result, it may be possible to realize a semiconductor device with improved electric characteristics.

In methods of fabricating a semiconductor device according to some example embodiments of the inventive concepts, a planarization process may be performed to selectively remove the via only from a region on the penetration contact. In a process of forming the interconnection line on the penetration contact, a process margin may be increased, compared with the case in which the via is formed between the penetration contact and the interconnection line. As a result, it may be possible to realize a semiconductor device with improved reliability characteristics.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While some example embodiments of the inventive concepts have been particularly shown and described, it will be understood by one of ordinary skill in the art that variations in form and detail may be made therein without departing from the spirit and scope of the attached claims.

What is claimed is:

1. A stack of semiconductor chips, comprising:
   a memory chip; and
   a logic chip stacked on the memory chip, the logic chip including
     a substrate, on which an integrated circuit is formed;
     a metal layer on the substrate; and
     a penetration contact below the metal layer penetrating the substrate,
   the penetration contact being connected to a metal layer of the memory chip,
   the metal layer of the logic chip includes a first metal layer, the first metal layer being a lowermost layer of the metal layer and the first metal layer includes a first interconnection line, a second interconnection line, and a via below the second interconnection line,
   a top surface of the penetration contact is in direct contact with a bottom surface of the first interconnection line,
   a top surface of the via is in direct contact with a bottom surface of the second interconnection line, and
   the lowermost level of the bottom surface of the first interconnection line is lower than the lowermost level of the bottom surface of the second interconnection line.

2. The stack of semiconductor chips of claim 1, wherein the logic chip further includes:
   an etch stop layer between the first metal layer and the substrate, an upper portion of the penetration contact protruding above the etch stop layer; and
   a protection insulating pattern covering a side surface of the upper portion of the penetration contact.

3. The stack of semiconductor chips of claim 2, wherein the side surface of the upper portion of the penetration contact includes a first upper side surface and a second upper side surface on the first upper side surface,
   the etch stop layer covers the first upper side surface, and
   the protection insulating pattern covers the second upper side surface.

4. The stack of semiconductor chips of claim 3, wherein the protection insulating pattern is vertically extended from a top surface of the etch stop layer to the bottom surface of the first interconnection line along the second upper side surface.

5. The stack of semiconductor chips of claim 2, wherein the protection insulating pattern partially covers a top surface the etch stop layer adjacent to the penetration contact.

6. The stack of semiconductor chips of claim 2, wherein a bottom surface of the etch stop layer is coplanar with a bottom surface of the via.

7. The stack of semiconductor chips of claim 1, wherein the top surface of the penetration contact includes a concave recess, and
   the bottom surface of the first interconnection line has a convex profile corresponding to the top surface of the penetration contact.

8. The stack of semiconductor chips of claim 1, wherein the logic chip further includes an intermediate connection layer between the substrate and the metal layer, the intermediate connection layer includes an active contact and a gate contact, and the via connects at least one of the active and gate contacts to the second interconnection line.

9. The stack of semiconductor chips of claim 1, wherein the memory chip is a DRAM chip or an SRAM chip.

10. The stack of semiconductor chips of claim 1, wherein the substrate of the logic chip includes:
a logic cell region on the integrated circuit; and
a dummy cell region on the penetration contact.

11. The stack of semiconductor chips of claim 10, wherein the logic chip further includes:
a logic transistor on the logic cell region; and
a dummy transistor on the dummy cell region,
wherein the logic transistor and the dummy transistor are each a three-dimensional field effect transistor.

12. The stack of semiconductor chips of claim 11, wherein each of the active and dummy transistors includes:
an active pattern on the substrate;
a device isolation layer filling a trench, which bisects the active pattern;
a gate electrode crossing the active pattern; and
a source/drain pattern adjacent to a side of the gate electrode,
wherein the penetration contact penetrates the device isolation layer of the dummy transistor.

13. The stack of semiconductor chips of claim 1, wherein the penetration contact includes:
a pillar shaped conductive pattern;
a barrier pattern enclosing an outer side surface of the conductive pattern; and
an insulating spacer enclosing an outer side surface of the barrier pattern.

14. A stack of semiconductor chips, comprising:
a memory chip; and
a logic chip stacked on the memory chip, the logic chip including
a substrate, on which an integrated circuit is formed;
an intermediate connection layer on the substrate;
a metal layer on the substrate on the intermediate connection layer;
an etch stop layer between the intermediate connection layer and the metal layer;
a penetration contact below the metal layer penetrating the substrate, an upper portion of the penetration contact protruding above the etch stop layer; and
a protection insulating pattern on the etch stop layer covering the upper portion of the penetration contact
the penetration contact being connected to a metal layer of the memory chip, the metal layer of the logic chip includes a first metal layer, the first metal layer being a lowermost layer of the metal layer and the first metal layer includes a first interconnection line, a second interconnection line, and a via below the second interconnection line, a side surface of the upper portion of the penetration contact includes a first upper side surface and a second upper side surface on the first upper side surface, the etch stop layer covers the first upper side surface, the protection insulating pattern covers the second upper side surface, and a top surface of the penetration contact is in direct contact with a bottom surface of the first interconnection line.

15. The stack of semiconductor chips of claim 14, wherein a top surface of the via is in direct contact with a bottom surface of the second interconnection line, and
the lowermost level of the bottom surface of the first interconnection line is lower than the lowermost level of the bottom surface of the second interconnection line.

16. The stack of semiconductor chips of claim 14, wherein the protection insulating pattern is vertically extended from a top surface of the etch stop layer to the bottom surface of the first interconnection line along the second upper side surface.

17. The stack of semiconductor chips of claim 14, wherein the protection insulating pattern partially covers a top surface of the etch stop layer adjacent to the penetration contact.

18. The stack of semiconductor chips of claim 14, wherein the substrate of the logic chip includes:
a logic cell region on the integrated circuit; and
a dummy cell region on the penetration contact.

19. The stack of semiconductor chips of claim 18, wherein the logic chip further includes:
a logic transistor on the logic cell region; and
a dummy transistor on the dummy cell region,
wherein the logic transistor and the dummy transistor are each a three-dimensional field effect transistor.

20. The stack of semiconductor chips of claim 19, wherein each of the active and dummy transistors includes:
an active pattern on the substrate;
a device isolation layer filling a trench, which bisects the active pattern;
a gate electrode crossing the active pattern; and
a source/drain pattern adjacent to a side of the gate electrode,
wherein the penetration contact penetrates the device isolation layer of the dummy transistor.

* * * * *